US012717235B2

(12) United States Patent
Shibayama et al.

(10) Patent No.: US 12,717,235 B2
(45) **Date of Patent: *Aug. 25, 2026**

(54) ALKALINE DEVELOPER SOLUABLE SILICON-CONTAINING RESIST UNDERLAYER FILM-FORMING COMPOSITION

(71) Applicant: NISSAN CHEMICAL CORPORATION, Tokyo (JP)

(72) Inventors: Wataru Shibayama, Toyama (JP); Makoto Nakajima, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 1102 days.

This patent is subject to a terminal disclaimer.

(21) Appl. No.: 17/667,595

(22) Filed: Feb. 9, 2022

(65) Prior Publication Data

US 2022/0155688 A1 May 19, 2022

Related U.S. Application Data

(63) Continuation of application No. 16/628,135, filed as application No. PCT/JP2018/025724 on Jul. 6, 2018, now Pat. No. 11,281,104.

(30) Foreign Application Priority Data

Jul. 6, 2017 (JP) ................................ 2017-133095

(51) Int. Cl.

| | |
|---|---|
| ***G03F 7/11*** | (2006.01) |
| ***C08G 77/14*** | (2006.01) |
| ***C09D 183/06*** | (2006.01) |
| ***G03F 7/16*** | (2006.01) |
| ***G03F 7/32*** | (2006.01) |
| ***H10P 14/60*** | (2026.01) |
| ***H10P 50/00*** | (2026.01) |
| ***H10P 50/24*** | (2026.01) |
| ***H10P 76/00*** | (2026.01) |
| ***H10P 76/20*** | (2026.01) |

(52) U.S. Cl.

CPC ................ *G03F 7/11* (2013.01); *C08G 77/14* (2013.01); *C09D 183/06* (2013.01); *G03F 7/162* (2013.01); *G03F 7/168* (2013.01); *G03F 7/322* (2013.01); *H10P 14/6342* (2026.01); *H10P 50/242* (2026.01); *H10P 50/691* (2026.01); *H10P 76/00* (2026.01); *H10P 76/2041* (2026.01)

(58) Field of Classification Search

CPC ..... H01L 21/00–86; G03F 7/00–70991; C08G 77/00–80; C09D 183/00–16

See application file for complete search history.

(56) References Cited

U.S. PATENT DOCUMENTS

| | | | | |
|---|---|---|---|---|
| 2005/0282090 | A1 | 12/2005 | Hirayama et al. | |
| 2010/0304295 | A1 | 12/2010 | Kinsho et al. | |
| 2011/0236835 | A1 | 9/2011 | Fu et al. | |
| 2013/0078814 | A1 | 3/2013 | Shibayama et al. | |
| 2014/0120730 | A1* | 5/2014 | Nakajima | G03F 7/0752 524/588 |
| 2014/0178822 | A1 | 6/2014 | Wu et al. | |
| 2014/0342292 | A1 | 11/2014 | Fu et al. | |
| 2015/0004791 | A1 | 1/2015 | Ogihara et al. | |
| 2015/0079792 | A1 | 3/2015 | Shigaki et al. | |
| 2015/0316850 | A1 | 11/2015 | Someya et al. | |
| 2016/0363861 | A1 | 12/2016 | Ongayi et al. | |
| 2017/0045818 | A1* | 2/2017 | Karasawa | G03F 7/162 |
| 2017/0153549 | A1* | 6/2017 | Shibayama | C09D 183/04 |
| 2017/0371242 | A1* | 12/2017 | Wakayama | C09D 183/06 |
| 2018/0335698 | A1 | 11/2018 | Nakajima et al. | |
| 2020/0225584 | A1* | 7/2020 | Shibayama | C08K 5/09 |

FOREIGN PATENT DOCUMENTS

| | | | |
|---|---|---|---|
| JP | 2004-341479 | A | 12/2004 |
| JP | 2012-511742 | A | 5/2012 |
| JP | 2015-028145 | A | 2/2015 |
| JP | 2015-505335 | A | 2/2015 |
| JP | 2015-197596 | A | 11/2015 |
| JP | 2017-020000 | A | 1/2017 |
| JP | 2017-83849 | A | 5/2017 |

(Continued)

OTHER PUBLICATIONS

Jun. 2, 2023 Office Action issued in Korean Patent Application No. 10-2020-7000163.

(Continued)

*Primary Examiner* — Duy Vu N Deo
*Assistant Examiner* — Andrew K Laobak
(74) *Attorney, Agent, or Firm* — Oliff PLC

(57) ABSTRACT

A composition for forming a resist underlayer film for lithography, the resist underlayer film for lithography containing silicon and being dissolved and removed with an alkaline developer in accordance with a resist pattern together with an upper layer resist during development of the upper layer resist, the composition comprising a component, which is a silane compound containing a hydrolyzable silane, a hydrolysate of the silane, a hydrolytic condensate of the silane, or any combination of these, and an element, which is an element of causing dissolution in an alkaline developer. The element, which is an element of causing dissolution in an alkaline developer, is contained in the structure of the compound as the component.

9 Claims, No Drawings

(56) References Cited

FOREIGN PATENT DOCUMENTS

| | | | | |
|---|---|---|---|---|
| TW | 201100968 | A | * | 1/2011 |
| WO | 2016/080226 | A1 | | 5/2016 |

OTHER PUBLICATIONS

Dec. 19, 2023 Office Action issued in Korean Patent Application No. 10-2020-7000163.
Sep. 11, 2018 Written Opinion issued in International Patent Application No. PCT/JP2018/025724.
Sep. 11, 2018 International Search Report issued in International Patent Application No. PCT/JP2018/025724.

* cited by examiner

ALKALINE DEVELOPER SOLUABLE SILICON-CONTAINING RESIST UNDERLAYER FILM-FORMING COMPOSITION

This application is a continuation application of U.S. application Ser. No. 16/628,135 filed Jan. 2, 2020, which in turn is a U.S. national stage application of PCT/JP2018/025724 filed Jul. 6, 2018. Each of the prior application is incorporated herein by reference in its entirety.

TECHNICAL FIELD

The present invention relates to a composition for forming an underlayer film between a substrate and a resist (e.g., a photoresist or an electron beam resist) for use in the production of a semiconductor device.

BACKGROUND ART

Fine processing by lithography using photoresists has been conventionally performed in the production of semiconductor devices. The fine processing is a processing method involving formation of a photoresist thin film on a semiconductor substrate (e.g., a silicon wafer); irradiation of the thin film with active rays (e.g., ultraviolet rays) through a mask pattern having a semiconductor device pattern drawn thereon; development of the irradiated thin film; and etching of the substrate with the resultant photoresist pattern serving as a protective film, to thereby form, on the surface of the substrate, fine irregularities corresponding to the pattern. In recent years, active rays having a shorter wavelength have tended to be used (i.e., shifting from KrF excimer laser (248 nm) to ArF excimer laser (193 nm)) in association with an increase in the degree of integration of semiconductor devices. This tendency causes a serious problem in terms of the influence of reflection of active rays from a semiconductor substrate.

A film known as a hard mask and containing a metal element (e.g., silicon or titanium) has been used as an underlayer film between a semiconductor substrate and a photoresist. In this case, the components of the photoresist significantly differ from those of the hard mask, and thus the rate of removal of these by dry etching greatly depends on the types of gas used for dry etching. The appropriate selection of a gas type enables the hard mask to be removed by dry etching without a large reduction in the thickness of the photoresist. Thus, in the recent production of semiconductor devices, a resist underlayer film has been disposed between a semiconductor substrate and a photoresist so as to achieve various effects, such as an antireflection effect. Although compositions for resist underlayer films have hitherto been studied, demand has arisen for development of a novel material for resist underlayer films because of, for example, various properties required for the films.

A resist underlayer film removable by a wet process has conventionally been used for etching of the resist underlayer film with a developer for an upper layer resist.

An anti-reflective coating has been disclosed which contains a polysiloxane having a carboxylic acid group or a carboxylic acid forming group and a chemical group selected from a substituted phenyl group, an ester group, a polyether group, a mercapto group, a sulfur-containing organic functional group, a hydroxyl forming group, and an aryl sulfonate ester group, and which can be removed by a wet process with an organic solvent after processing of a substrate (see Patent Document 1).

A resist underlayer film has been disclosed which contains a polysiloxane prepared by hydrolysis and condensation between a silane having two hydrolyzable groups and a silane having three hydrolyzable groups, and which can be removed by a wet process with an organic solvent after processing of a substrate (see Patent Document 2).

PRIOR ART DOCUMENTS

Patent Documents

Patent Document 1: Japanese Patent Application Publication (Translation of PCT Application) No. 2012-511742 (JP 2012-511742 A)

Patent Document 2: Japanese Patent Application Publication No. 2017-020000 (JP 2017-020000 A)

SUMMARY OF THE INVENTION

Problems to be Solved by the Invention

An object of the present invention is to provide a resist underlayer film that can be removed, in accordance with a resist pattern, simultaneously with development of a photoresist present above the resist underlayer film by using an alkaline developer for development of the photoresist after light exposure.

Means for Solving the Problems

A first aspect of the present invention is a composition for forming a resist underlayer film for lithography, the resist underlayer film for lithography containing silicon and being dissolved and removed with an alkaline developer in accordance with a resist pattern together with an upper layer resist during development of the upper layer resist, the composition comprising:

a component (a), which is a silane compound containing a hydrolyzable silane, a hydrolysate of the silane, a hydrolytic condensate of the silane, or any combination of these, characterized in that the composition further comprises:

an element (b), which is an element of causing dissolution in an alkaline developer, as an element independent of the component (a) or as a structural element of the compound as the component (a).

A second aspect of the present invention is the composition for forming a resist underlayer film for lithography according to the first aspect, wherein the element (b), which is an element of causing dissolution in an alkaline developer, is contained in the structure of the compound as the component (a), and the component (a) contains (b1) a hydrolyzable silane of the following Formula (1):

Formula (1)

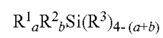

$$R^1_aR^2_bSi(R^3)_{4-(a+b)}$$

[wherein $R^1$ is an organic group containing a phenolic hydroxyl group, or an organic group of the following Formula (1-1), (1-2), (1-3), (1-4), or (1-5):

Formula (1-1)

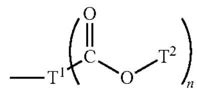

-continued

Formula (1-2)

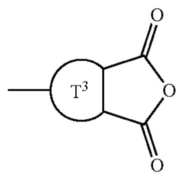

Formula (1-3)

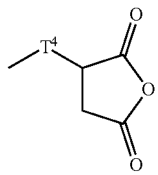

Formula (1-4)

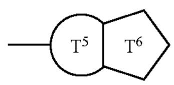

Formula (1-5)

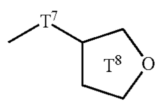

(in Formulae (1-1), (1-2), (1-3), (1-4), and (1-5), $T^1$, $T^4$, and $T^7$ are each an alkylene group, a cyclic alkylene group, an alkenylene group, an arylene group, a sulfur atom, an oxygen atom, an oxycarbonyl group, an amide group, a secondary amino group, or any combination of these; $T^2$ is an alkyl group or a hydrogen atom; $T^3$ and $T^5$ are each an aliphatic ring or an aromatic ring; $T^6$ and $T^8$ are each a lactone ring; and n is an integer of 1 or 2), is bonded to the silicon atom via an Si—C bond, and is the element (b) contained in the structure of the compound as the component (a);

$R^2$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, and is bonded to the silicon atom via an Si—C bond;

$R^3$ is an alkoxy group, an acyloxy group, or a halogen atom; and a is an integer of 1, b is an integer of 0 or 1, and a+b is an integer of 1 or 2], a hydrolysate of the silane, a hydrolytic condensate of the silane, or any combination of these, and wherein the hydrolyzable silane of Formula (1) is contained in an amount of 30% by mole to 100% by mole relative to the entire silane.

A third aspect of the present invention is the composition for forming a resist underlayer film according to the first aspect, wherein the element (b), which is an element of causing dissolution in an alkaline developer, is (b2) a photoacid generator, and the element (b2) is contained in an amount of 30% by mass to 60% by mass relative to the entire silane as a mixture of the component (a) and the element (b).

A fourth aspect of the present invention is the composition for forming a resist underlayer film for lithography according to any one of the first to third aspects, wherein the hydrolyzable silane is a hydrolyzable silane of Formula (1), an additional hydrolyzable silane, or a combination thereof, and the additional hydrolyzable silane is at least one organosilicon compound selected from the group consisting of organosilicon compounds of the following Formula (2):

Formula (2)

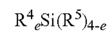

$$R^4_eSi(R^5)_{4-e}$$

(wherein $R^4$ is an alkyl group, an aryl group, a halogenated alkyl group, a halogenated aryl group, an alkoxyaryl group, an alkoxyalkoxyaryl group, an acyloxyaryl group, an acid-unstable group-containing aryl group, an alkenyl group, or an organic group having an epoxy group, an acryloyl group, a methacryloyl group, a mercapto group, or a cyano group, and is bonded to the silicon atom via an Si—C bond; $R^5$ is an alkoxy group, an acyloxy group, or a halogen atom; and e is an integer of 0 to 3) and the following Formula (3):

Formula (3)

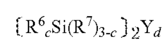

$$\{R^6_cSi(R^7)_{3-c}\}_2Y_d$$

(wherein $R^6$ is an alkyl group and is bonded to the silicon atom via an Si—C bond; $R^7$ is an alkoxy group, an acyloxy group, or a halogen atom; Y is an alkylene group or an arylene group; c is an integer of 0 or 1; and d is an integer of 0 or 1).

A fifth aspect of the present invention is the composition for forming a resist underlayer film for lithography according to the fourth aspect, wherein the composition comprises, as a polymer, a hydrolysate of a hydrolyzable silane of Formula (1) as defined in the second aspect and a hydrolyzable silane of Formula (2) as defined in the fourth aspect.

A sixth aspect of the present invention is the composition for forming a resist underlayer film for lithography according to any one of the first to fifth aspects, wherein the composition further comprises an acid.

A seventh aspect of the present invention is the composition for forming a resist underlayer film for lithography according to any one of the first to sixth aspects, wherein the composition further comprises water.

An eighth aspect of the present invention is a method for producing a resist underlayer film for lithography, the method comprising a step of applying the composition for forming a resist underlayer film for lithography according to any one of the first to seventh aspects onto a semiconductor substrate; and a step of baking the composition for forming a resist underlayer film for lithography.

A ninth aspect of the present invention is a method for producing a semiconductor device, the method comprising:

- a step (I) of applying the composition for forming a resist underlayer film for lithography according to any one of the first to seventh aspects onto a semiconductor substrate;
- a step (II) of baking the composition for forming a resist underlayer film for lithography, to thereby form a resist underlayer film for lithography;
- a step (III) of applying a resist composition to the surface of the underlayer film, to thereby form a resist film;
- a step (IV) of exposing the resist film to light;
- a step (V) of developing the resist and removing the resist underlayer film for lithography in accordance with a resist pattern by using an alkaline developer, to thereby form a pattern transferred from the resist pattern; and a step (VI) of processing the semiconductor substrate with the patterned resist and resist underlayer film for lithography.

A tenth aspect of the present invention is the method for producing a semiconductor device according to the ninth aspect, wherein the method comprises a step of removing the resist underlayer film used for the substrate processing with an alkaline aqueous solution after the step (VI).

An eleventh aspect of the present invention is a method for producing a semiconductor device, the method comprising:

- a step (i) of forming an organic underlayer film on the surface of a semiconductor substrate;
- a step (ii) of applying the composition for forming a resist underlayer film for lithography according to any one of the first to seventh aspects to the surface of the organic underlayer film;
- a step (iii) of baking the composition for forming a resist underlayer film for lithography, to thereby form a resist underlayer film for lithography;
- a step (iv) of applying a resist composition to the surface of the resist underlayer film for lithography, to thereby form a resist film;
- a step (v) of exposing the resist film to light;
- a step (vi) of developing the resist after the light exposure and removing the resist underlayer film for lithography in accordance with a resist pattern by using an alkaline developer, to thereby form a pattern transferred from the resist pattern;
- a step (vii) of etching the organic underlayer film with the patterned resist underlayer film for lithography; and
- a step (viii) of processing the semiconductor substrate with the patterned organic underlayer film.

A twelfth aspect of the present invention is the method for producing a semiconductor device according to the eleventh aspect, wherein the method comprises a step of removing the resist underlayer film used for the substrate processing with an alkaline aqueous solution after the step (viii).

Effects of the Invention

If a silicon-containing resist underlayer film (silicon hard mask layer), which is an underlayer film of a photoresist, can be patterned with a developer simultaneously with development of the photoresist in a lithography step using a multi-layer process, a conventionally performed dry etching step using a fluorine-containing gas can be omitted, resulting in process simplification.

The removal of the silicon-containing resist underlayer film (silicon hard mask layer) with a developer (in particular, an alkaline developer) is useful for preventing damage to a substrate during dry etching with a fluorine-containing gas.

The present invention relates to a resist underlayer film that can be removed, in accordance with a resist pattern, simultaneously with development of a photoresist present above the resist underlayer film by using an alkaline developer for development of the photoresist after light exposure.

MODES FOR CARRYING OUT THE INVENTION

The present invention is directed to a composition for forming a resist underlayer film for lithography, the resist underlayer film for lithography containing silicon and being dissolved and removed with an alkaline developer in accordance with a resist pattern together with an upper layer resist during development of the upper layer resist, the composition comprising:

- a component (a), which is a silane compound containing a hydrolyzable silane, a hydrolysate of the silane, a hydrolytic condensate of the silane, or any combination of these, characterized in that the composition further comprises:
- an element (b), which is an element of causing dissolution in an alkaline developer, as an element independent of the component (a) or as a structural element of the compound as the component (a).

When the light-exposed resist is positively developed, the resist and the resist underlayer film are removed by alkaline development with an alkaline aqueous solution.

The composition may contain, as optional components, an acid, water, an alcohol, a curing catalyst, an acid generator, another organic polymer, a light-absorbing compound, and a surfactant.

The resist underlayer film-forming composition of the present invention has a solid content of, for example, 0.1% by mass to 50% by mass, preferably 0.1% by mass to 30% by mass, more preferably 0.1% by mass to 25% by mass. The "solid content" as used herein refers to a value obtained by subtracting the amount of the solvent component from the total amount of all components of the resist underlayer film-forming composition.

The amounts of the hydrolyzable silane, the hydrolysate thereof, and the hydrolytic condensate thereof in the solid content is 20% by mass or more, for example, 50% by mass to 100% by mass, preferably 60% by mass to 100% by mass, more preferably 70% by mass to 100% by mass.

The aforementioned hydrolyzable silane, hydrolysate thereof, and hydrolytic condensate thereof may be used in the form of a mixture of these. The composition may contain a condensate of a hydrolysate prepared through hydrolysis of the hydrolyzable silane. The composition may contain a mixture of the hydrolytic condensate with a silane compound and a partial hydrolysate prepared through incomplete hydrolysis of the hydrolyzable silane during preparation of the hydrolytic condensate. The condensate is a polymer having a polysiloxane structure.

The element (b), which is an element of causing dissolution in an alkaline developer, is contained in the structure of the compound as the component (a), and the component (a) contains (b1) a hydrolyzable silane of Formula (1), a hydrolysate of the silane, a hydrolytic condensate of the silane, or any combination of these. The hydrolyzable silane of Formula (1) may be contained in an amount of 30% by mole to 100% by mole relative to the entire silane. When the dissolution-causing element (b) is the element (b1), the hydrolyzable silane of Formula (1) may be contained in an amount of 30% by mole to 60% by mole relative to the entire silane.

When the element (b), which is an element of causing dissolution in an alkaline developer, is the photoacid generator (b2), a carboxyl group or a hydroxyl group contained in a unit structure of a polysiloxane forms an acetal bond with, for example, a vinyl ether compound, and the acetal bond is cleaved by an acid generated from the photoacid generator during light exposure, whereby the structural unit contained in the polysiloxane is 100% converted into a structural unit based on the hydrolyzable silane of Formula (1). Thus, the hydrolyzable silane of Formula (1) is contained in an amount of 30% by mole to 100% by mole relative to the entire silane.

In the present invention, the element (b) of causing dissolution in an alkaline developer is an element that generates a cause of dissolution of the composition in the alkaline developer. The element (b) may be based only on the element (b1), or may be based on the element (b2) for causing generation of the element (b1). When the element (b) is based only on the element (b1), the hydrolyzable silane of Formula (1) may be contained in an amount of 30% by mole to 60% by mole relative to the entire silane. When the element (b) is based on the element (b2) for causing generation of the element (b1), the hydrolyzable silane of Formula (1) may be contained in an amount of 30% by mole to 100% by mole relative to the entire silane.

In Formula (1), $R^1$ is an organic group containing a phenolic hydroxyl group, or an organic group of Formula (1-1), (1-2), (1-3), (1-4), or (1-5), and is bonded to the silicon atom via an Si—C bond; $R^2$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, and is bonded to the silicon atom via an Si—C bond; $R^3$ is an alkoxy group, an acyloxy group, or a halogen atom; and a is an integer of 1, b is an integer of 0 or 1, and a+b is an integer of 1 or 2.

In Formulae (1-1), (1-2), (1-3), (1-4), and (1-5), $T^1$, $T^4$, and $T^7$ are each an alkylene group, a cyclic alkylene group, an alkenylene group, an arylene group, a sulfur atom, an oxygen atom, an oxycarbonyl group, an amide group, a secondary amino group, or any combination of these; $T^2$ is an alkyl group or a hydrogen atom; $T^3$ and $T^5$ are each an aliphatic ring or an aromatic ring; $T^6$ and $T^8$ are each a lactone ring; and n is an integer of 1 or 2.

The aforementioned alkyl group is a linear or branched alkyl group having a carbon atom number of 1 to 10. Examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The alkyl group may be a cyclic alkyl group. Examples of cyclic alkyl groups having a carbon atom number of 1 to 10 include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The alkylene group may be, for example, an alkylene group derived from any of the aforementioned alkyl groups. Examples of such an alkylene group include methylene group derived from methyl group, ethylene group derived from ethyl group, and propylene group derived from propyl group.

The alkenyl group is a $C_{2-10}$ alkenyl group, and examples thereof include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

The alkenylene group is, for example, an alkenylene group derived from any of the aforementioned alkenyl groups.

The aryl group is, for example, a $C_{6-20}$ aryl group, and examples thereof include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

The arylene group is, for example, an arylene group derived from any of the aforementioned aryl groups.

The arylene group is, for example, an organic group prepared by substitution of such an arylene group with a halogen atom (e.g., fluorine, chlorine, bromine, or iodine).

Examples of the organic group having an epoxy group include glycidoxymethyl group, glycidoxyethyl group, glycidoxypropyl group, glycidoxybutyl group, and epoxycyclohexyl group.

Examples of the organic group having an acryloyl group include acryloylmethyl group, acryloylethyl group, and acryloylpropyl group.

Examples of the organic group having a methacryloyl group include methacryloylmethyl group, methacryloylethyl group, and methacryloylpropyl group.

Examples of the organic group having a mercapto group include ethylmercapto group, butylmercapto group, hexylmercapto group, and octylmercapto group.

Examples of the organic group having a cyano group include cyanoethyl group and cyanopropyl group.

The aforementioned $C_{1-20}$ alkoxy group is, for example, an alkoxy group having a linear, branched, or cyclic alkyl moiety having a carbon atom number of 1 to 20. Examples of the alkoxy group include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Examples of the aforementioned $C_{2-20}$ acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the aforementioned halogen atom include fluorine, chlorine, bromine, and iodine.

Examples of the hydrolyzable silane of Formula (1) are as follows.

Formula (1-1-1)

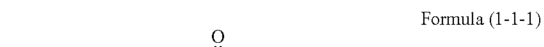

Formula (1-1-2)

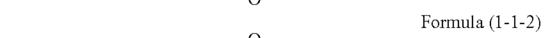

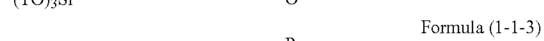

Formula (1-1-3)

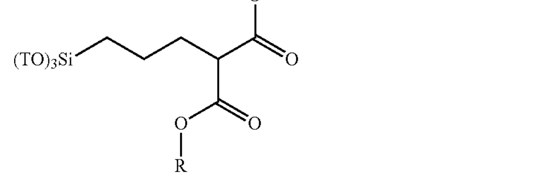

Formula (1-1-4)

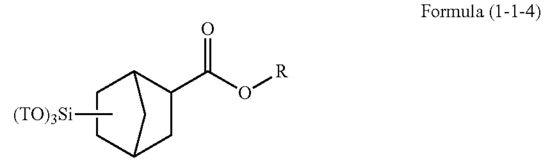

Formula (1-1-5)

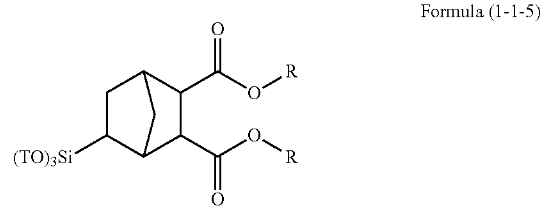

Formula (1-1-6)

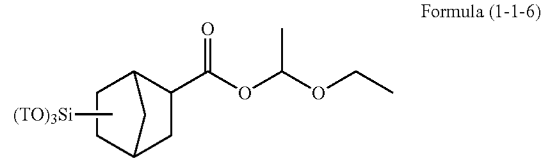

-continued

Formula (1-1-7)

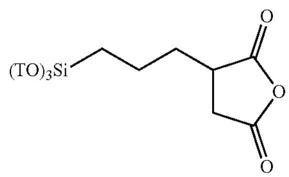

Formula (1-1-8)

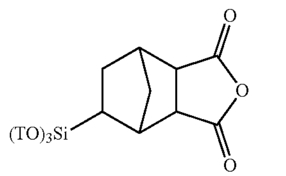

Formula (1-1-9)

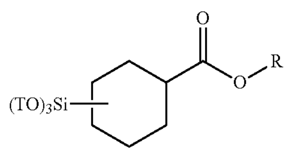

Formula (1-1-10)

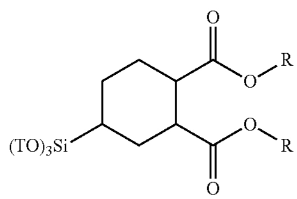

Formula (1-1-11)

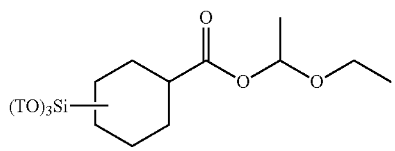

Formula (1-1-12)

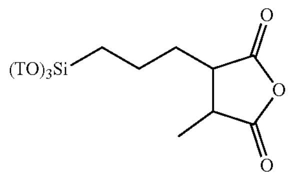

Formula (1-1-13)

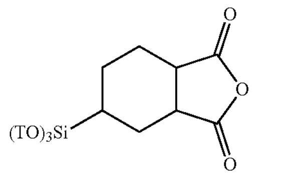

Formula (1-1-14)

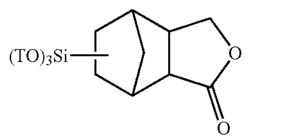

Formula (1-1-15)

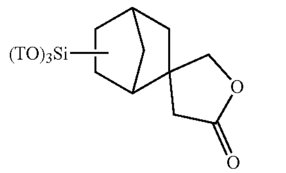

-continued

Formula (1-1-16)

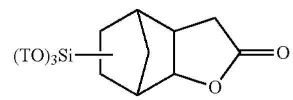

Formula (1-1-17)

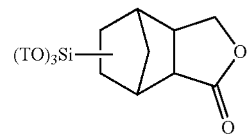

Formula (1-1-18)

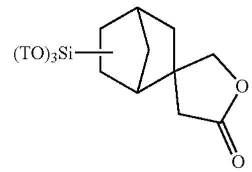

Formula (1-1-19)

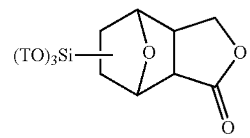

Formula (1-1-20)

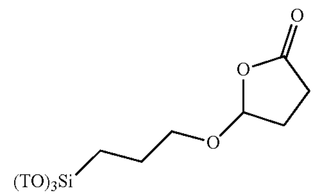

Formula (1-1-21)

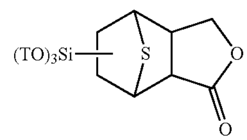

Formula (1-1-22)

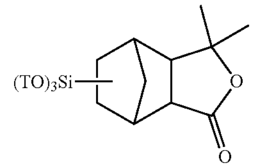

Formula (1-1-23)

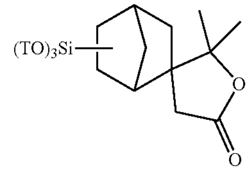

T in the aforementioned formulae is an alkyl group that may be any of the above-exemplified alkyl groups. The alkyl group is preferably, for example, a methyl group or an ethyl group.

Examples of R in the aforementioned formulae are as follows.

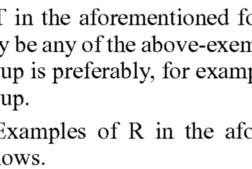

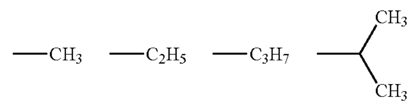

-continued

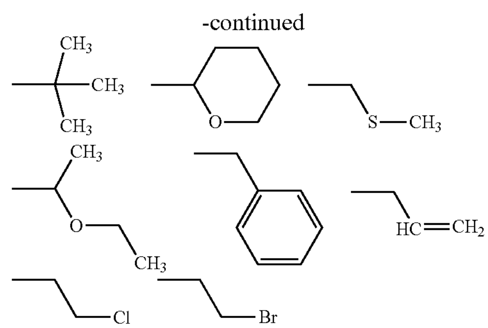

In the present invention, the hydrolyzable silane is a hydrolyzable silane of Formula (1), an additional hydrolyzable silane, or a combination thereof, and the additional hydrolyzable silane is at least one organosilicon compound selected from the group consisting of organosilicon compounds of Formulae (2) and (3).

In Formula (2), $R^4$ is an alkyl group, an aryl group, a halogenated alkyl group, a halogenated aryl group, an alkoxyaryl group, an alkoxyalkoxyaryl group, an acyloxyaryl group, an acid-unstable group-containing aryl group, an alkenyl group, or an organic group having an epoxy group, an acryloyl group, a methacryloyl group, a mercapto group, or a cyano group, and is bonded to the silicon atom via an Si—C bond; $R^5$ is an alkoxy group, an acyloxy group, or a halogen atom; and e is an integer of 0 to 3. These chemical groups may be as exemplified above.

In Formula (3), $R^6$ is an alkyl group and is bonded to the silicon atom via an Si—C bond; $R^7$ is an alkoxy group, an acyloxy group, or a halogen atom; Y is an alkylene group or an arylene group; c is an integer of 0 or 1; and d is an integer of 0 or 1. These chemical groups may be as exemplified above.

Specific examples of the organosilicon compound of Formula (2) include tetramethoxysilane, tetrachlorosilane, tetraacetoxysilane, tetraethoxysilane, tetra-n-propoxysilane, tetraisopropoxysilane, tetra-n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, methylvinyldiethoxysilane, acetoxymethyltrimethoxysilane, acetoxyethyltrimethoxysilane, acetoxypropyltrimethoxysilane, acetoxymethyltriethoxysilane, acetoxyethyltriethoxysilane, and acetoxypropyltriethoxysilane.

The aryl group of $R^4$ in Formula (2) is preferably a substituted aryl group; for example, a substituted phenyl group. Examples of the silane having such a substituted phenyl group (e.g., an alkoxyphenyl group, an alkoxyalkoxyphenyl group, or an acyloxyphenyl group, or an organic group containing it) are as follows.

Formula (B-1)

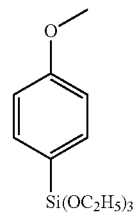

Formula (B-2)

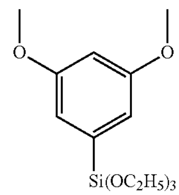

Formula (B-3)

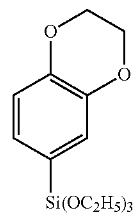

-continued
Formula (B-4)
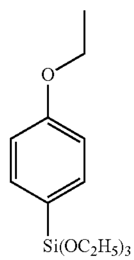
Formula (B-5)
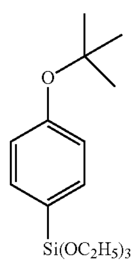
Formula (B-6)
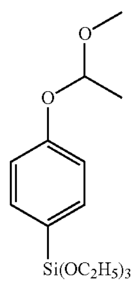
Formula (B-7)
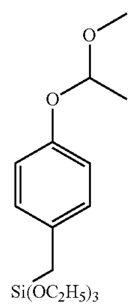
Formula (B-8)
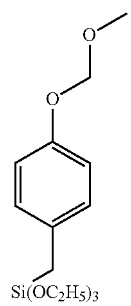
-continued
Formula (B-9)
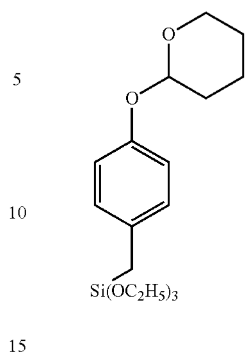
Formula (B-10)
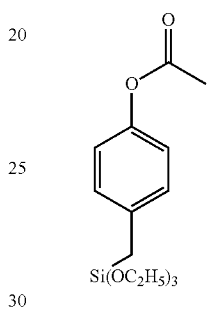
Formula (B-11)
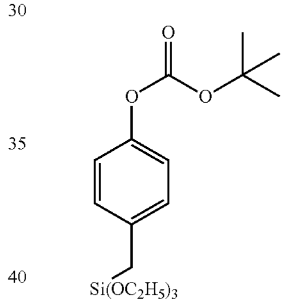
Formula (B-12)
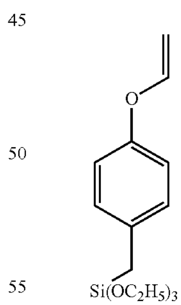
Formula (B-13)
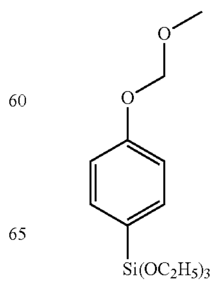

-continued
Formula (B-14)
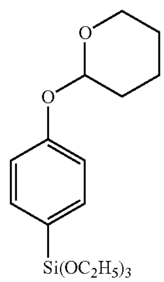
Formula (B-15)
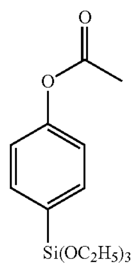
Formula (B-16)
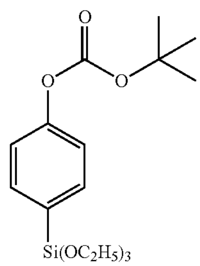
Formula (B-17)
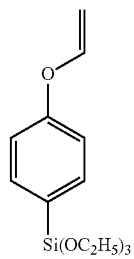
Formula (B-18)
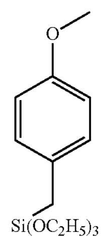
Formula (B-19)
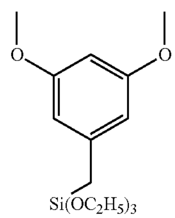
-continued
Formula (B-20)
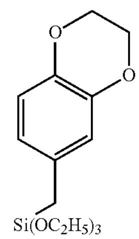
Formula (B-21)
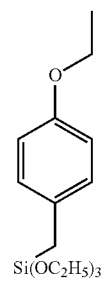
Formula (B-22)
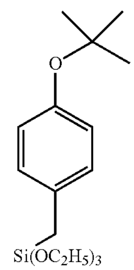
Formula (B-23)
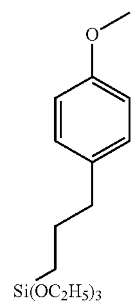
Formula (B-24)
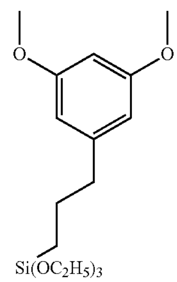

-continued
Formula (B-25)
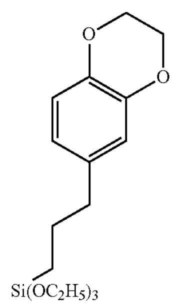
Formula (B-26)
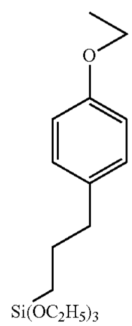
Formula (B-27)
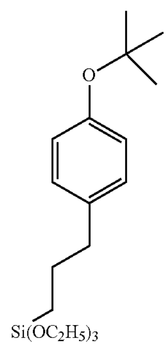
Formula (B-28)
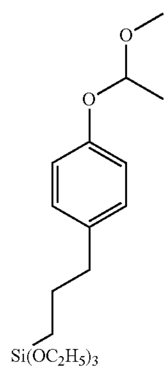
-continued
Formula (B-29)
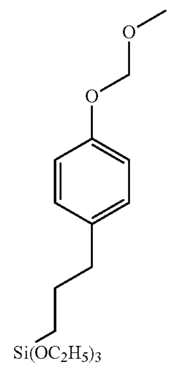
Formula (B-30)
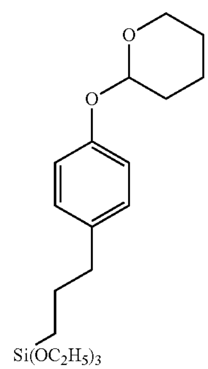
Formula (B-31)
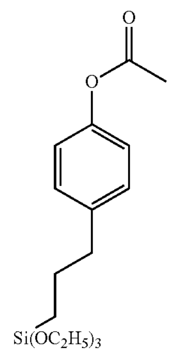
Formula (B-32)
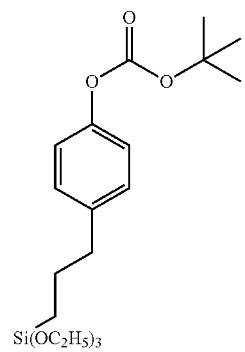

-continued

Formula (B-33)

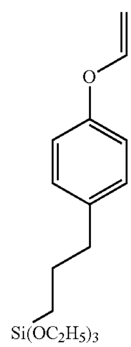

Formula (B-34)

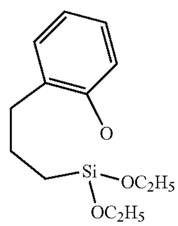

Formula (B-35)

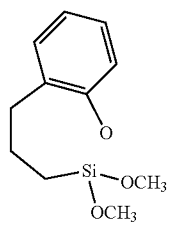

Formula (B-36)

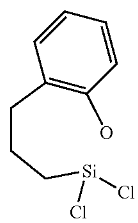

Formula (B-37)

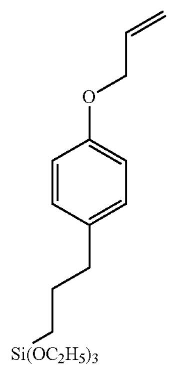

-continued

Formula (B-38)

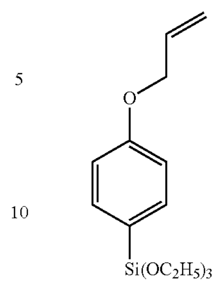

Formula (B-39)

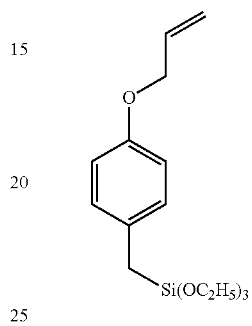

Specific examples of the organosilicon compound of Formula (3) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Other examples of the hydrolyzable silane are as follows.

Formula (2-1-1)

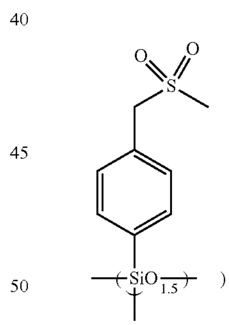

Formula (2-1-2)

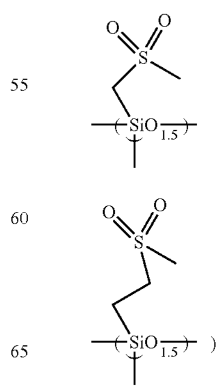

Formula (2-1-3)

-continued

Formula (2-1-4)

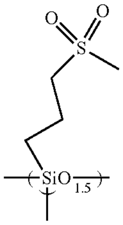

Formula (2-1-5)

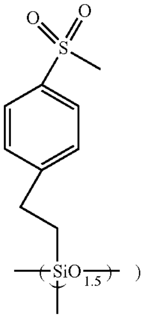

Formula (2-1-6)

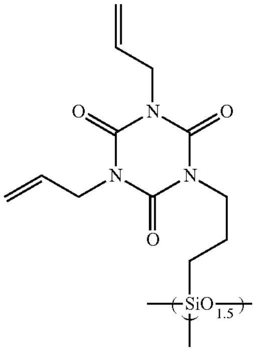

Formula (2-1-7)

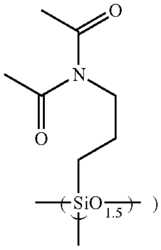

Formula (2-1-8)

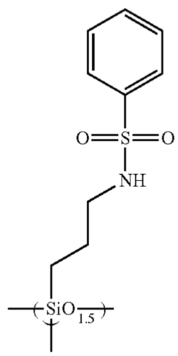

In the present invention, the composition may contain, as a polymer, a hydrolysate of the hydrolyzable silane of Formula (1) and the hydrolyzable silane of Formula (2).

The ratio by mole of the hydrolyzable silane of Formula (1) to the additional hydrolyzable silane may be 1:0.1 to 100, or 1:1 to 100, or 1:1 to 50, or 1:1 to 20.

Specific examples of the polysiloxane used as the component (a) in the present invention are as follows.

Formula (4-1)

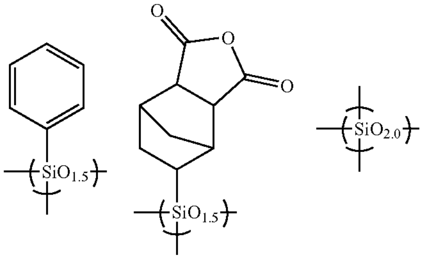

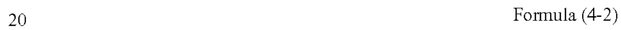

Formula (4-2)

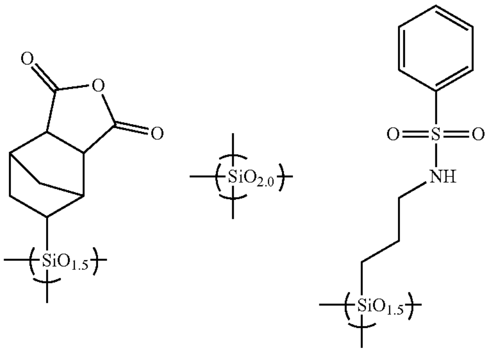

Formula (4-3)

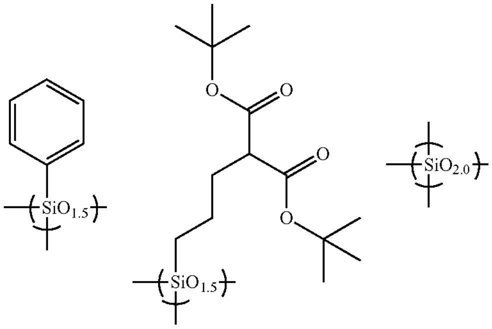

Formula (4-4)

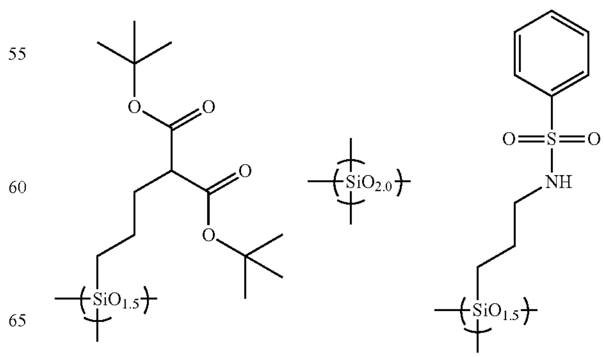

-continued

Formula (4-5)

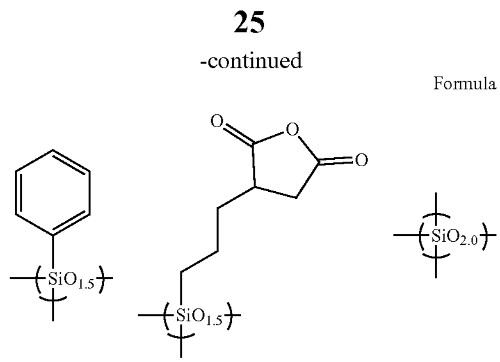

Formula (4-6)

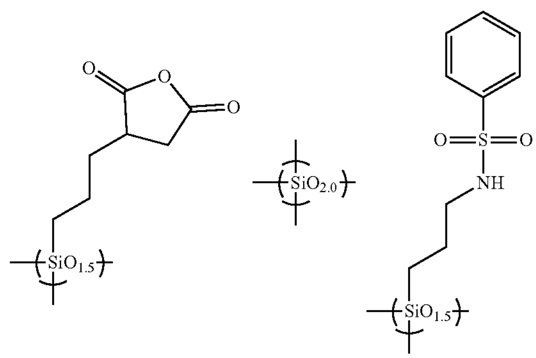

Formula (4-7)

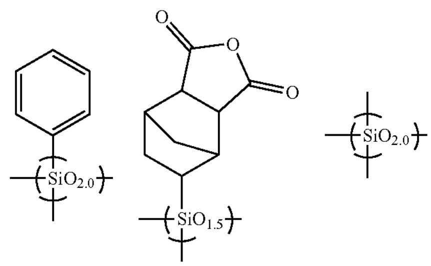

Formula (4-8)

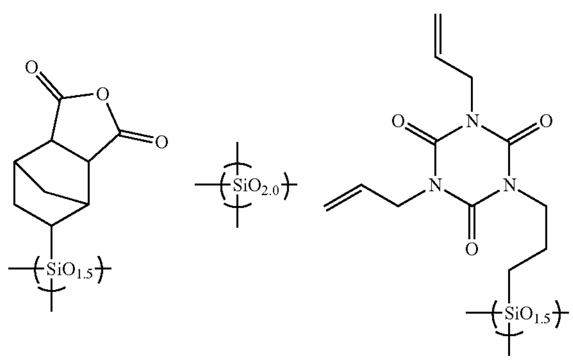

Formula (4-9)

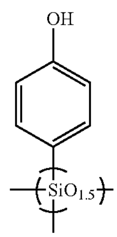

-continued

Formula (4-10)

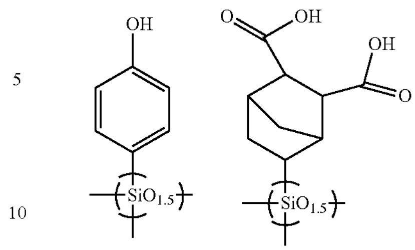

Formula (4-11)

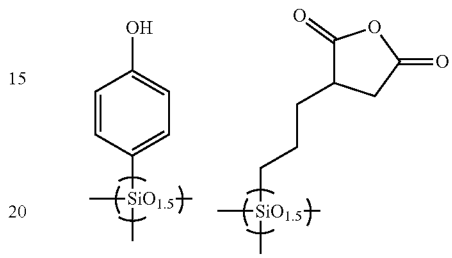

The hydrolytic condensate (polyorganosiloxane) of the aforementioned hydrolyzable silane may have a weight average molecular weight of 1,000 to 1,000,000 or 1,000 to 100,000. The molecular weight is determined by GPC analysis in terms of polystyrene.

The GPC analysis can be performed under, for example, the following conditions: GPC apparatus (trade name: HLC-8220GPC, available from Tosoh Corporation), GPC columns (trade name: Shodex KF803L, KF802, and KF801, available from Showa Denko K.K.), a column temperature of 40° C., tetrahydrofuran serving as an eluent (elution solvent), a flow amount (flow rate) of 1.0 ml/min, and polystyrene (available from Showa Denko K.K.) as a standard sample.

For the hydrolysis of an alkoxysilyl group, an acyloxysilyl group, or a halogenated silyl group, 0.5 mol to 100 mol (preferably 1 mol to 10 mol) of water is used per mol of the hydrolyzable group.

Furthermore, 0.001 mol to 10 mol (preferably 0.001 mol to 1 mol) of a hydrolysis catalyst may be used per mol of the hydrolyzable group.

The reaction temperature for hydrolysis and condensation is generally 20° C. to 80° C.

The hydrolysis may be completely or partially performed. Thus, a hydrolysate or a monomer may remain in the resultant hydrolytic condensate.

A catalyst may be used for the hydrolysis and condensation.

Examples of the hydrolysis catalyst include a metal chelate compound, an organic acid, an inorganic acid, an organic base, and an inorganic base.

Examples of the metal chelate compound serving as the hydrolysis catalyst include titanium chelate compounds, such as triethoxy mono(acetylacetonato)titanium, tri-n-propoxy mono(acetylacetonato)titanium, tri-i-propoxy mono(acetylacetonato)titanium, tri-n-butoxy mono(acetylacetonato)titanium, tri-sec-butoxy mono(acetylacetonato) titanium, tri-t-butoxy mono(acetylacetonato)titanium, diethoxy bis(acetylacetonato)titanium, di-n-propoxy bis (acetylacetonato)titanium, di-i-propoxy bis(acetylacetonato) titanium, di-n-butoxy bis(acetylacetonato)titanium, di-sec-butoxy bis(acetylacetonato)titanium, di-t-butoxy bis (acetylacetonato)titanium, monoethoxy tris (acetylacetonato)titanium, mono-n-propoxy tris (acetylacetonato)titanium, mono-i-propoxy tris (acetylacetonato)titanium, mono-n-butoxy tris (acetylacetonato)titanium, mono-sec-butoxy tris (acetylacetonato)titanium, mono-t-butoxy tris (acetylacetonato)titanium, tetrakis(acetylacetonato) titanium, triethoxy mono(ethyl acetoacetate)titanium, tri-n-propoxy mono(ethyl acetoacetate)titanium, tri-i-propoxy mono(ethyl acetoacetate)titanium, tri-n-butoxy mono(ethyl acetoacetate)titanium, tri-sec-butoxy mono(ethyl acetoacetate)titanium, tri-t-butoxy mono(ethyl acetoacetate)titanium, diethoxy bis(ethyl acetoacetate)titanium, di-n-propoxy bis(ethyl acetoacetate)titanium, di-i-propoxy bis (ethyl acetoacetate)titanium, di-n-butoxy bis(ethyl acetoacetate)titanium, di-sec-butoxy bis(ethyl acetoacetate) titanium, di-t-butoxy bis(ethyl acetoacetate)titanium, monoethoxy tris(ethyl acetoacetate)titanium, mono-n-propoxy tris (ethyl acetoacetate)titanium, mono-i-propoxy tris(ethyl acetoacetate)titanium, mono-n-butoxy tris(ethyl acetoacetate)titanium, mono-sec-butoxy tris(ethyl acetoacetate)titanium, mono-t-butoxy tris(ethyl acetoacetate)titanium, tetrakis(ethyl acetoacetate)titanium, mono(acetylacetonato)tris (ethyl acetoacetate)titanium, bis(acetylacetonato)bis(ethyl acetoacetate)titanium, and tris(acetylacetonato)mono(ethyl acetoacetate)titanium; zirconium chelate compounds, such as triethoxy mono(acetylacetonato)zirconium, tri-n-propoxy mono(acetylacetonato)zirconium, tri-i-propoxy mono (acetylacetonato)zirconium, tri-n-butoxy mono(acetylacetonato)zirconium, tri-sec-butoxy mono(acetylacetonato)zirconium, tri-t-butoxy mono(acetylacetonato)zirconium, diethoxy bis(acetylacetonato)zirconium, di-n-propoxy bis (acetylacetonato)zirconium, di-i-propoxy bis(acetylacetonato)zirconium, di-n-butoxy bis(acetylacetonato)zirconium, di-sec-butoxy bis(acetylacetonato)zirconium, di-t-butoxy bis(acetylacetonato)zirconium, monoethoxy tris(acetylacetonato)zirconium, mono-n-propoxy tris(acetylacetonato) zirconium, mono-i-propoxy tris(acetylacetonato)zirconium, mono-n-butoxy tris(acetylacetonato)zirconium, mono-sec-butoxy tris(acetylacetonato)zirconium, mono-t-butoxy tris (acetylacetonato)zirconium, tetrakis(acetylacetonato)zirconium, triethoxy mono(ethyl acetoacetate)zirconium, tri-n-propoxy mono(ethyl acetoacetate)zirconium, tri-i-propoxy mono(ethyl acetoacetate)zirconium, tri-n-butoxy mono (ethyl acetoacetate)zirconium, tri-sec-butoxy mono(ethyl acetoacetate)zirconium, tri-t-butoxy mono(ethyl acetoacetate)zirconium, diethoxy bis(ethyl acetoacetate)zirconium, di-n-propoxy bis(ethyl acetoacetate)zirconium, di-i-propoxy bis(ethyl acetoacetate)zirconium, di-n-butoxy bis(ethyl acetoacetate)zirconium, di-sec-butoxy bis(ethyl acetoacetate)zirconium, di-t-butoxy bis(ethyl acetoacetate)zirconium, monoethoxy tris(ethyl acetoacetate)zirconium, mono-n-propoxy tris(ethyl acetoacetate)zirconium, mono-i-propoxy tris(ethyl acetoacetate)zirconium, mono-n-butoxy tris(ethyl acetoacetate)zirconium, mono-sec-butoxy tris (ethyl acetoacetate)zirconium, mono-t-butoxy tris(ethyl acetoacetate)zirconium, tetrakis(ethyl acetoacetate)zirconium, mono(acetylacetonato)tris(ethyl acetoacetate)zirconium, bis(acetylacetonato)bis(ethyl acetoacetate)zirconium, and tris(acetylacetonato)mono(ethyl acetoacetate)zirconium; and aluminum chelate compounds, such as tris(acetylacetonato)aluminum and tris(ethyl acetoacetate)aluminum.

Examples of the organic acid serving as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid serving as the hydrolysis catalyst include hydrochloric acid, nitric acid, sulfuric acid, hydrofluoric acid, and phosphoric acid.

Examples of the organic base serving as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononene, diazabicycloundecene, and tetramethylammonium hydroxide. Examples of the inorganic base include ammonia, sodium hydroxide, potassium hydroxide, barium hydroxide, and calcium hydroxide. Among these catalysts, a metal chelate compound, an organic acid, and an inorganic acid are preferred. These catalysts may be used alone or in combination of two or more species.

Examples of the organic solvent used for the hydrolysis include aliphatic hydrocarbon solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcohol solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, pentanediol-2,4,2-methylpentanediol-2,4, hexanediol-2,5, heptanediol-2,4,2-ethylhexanedio1-1,3, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-1-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more species.

Particularly preferred are ketone solvents, such as acetone, methyl ethyl ketone, methyl-n-propyl ketone, methyl-n-butyl ketone, diethyl ketone, methyl-1-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone, in view of the preservation stability of the resultant solution.

In the present invention, the element (b), which is an element of causing dissolution in an alkaline developer, is (b2) a photoacid generator, and the element (b2) may be contained in an amount of 30% by mass to 60% by mass relative to the entire silane as a mixture of the component (a) and the element (b).

The photoacid generator generates an acid during the light exposure of a resist.

Examples of the photoacid generator include an onium salt compound, a sulfonimide compound, and a disulfonyldiazomethane compound.

Examples of the onium salt compound include iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

A single photoacid generator may be used alone, or two or more photoacid generators may be used in combination.

In the present invention, the element (b), which is an element of causing dissolution in an alkaline developer, is contained in the structure of the compound as the component (a), and the component (a) may be a combination of the element (b1); i.e., a hydrolyzable silane of Formula (1), a hydrolysate thereof, a hydrolytic condensate thereof, or any combination of these, and the element (b2); i.e., a photoacid generator.

In the present invention, bisphenol S or a bisphenol S derivative may be used as an additive. The amount of bisphenol S or a bisphenol S derivative is 0.01 parts by mass to 20 parts by mass, or 0.01 parts by mass to 10 parts by mass, or 0.01 parts by mass to 5 parts by mass relative to 100 parts by mass of the polyorganosiloxane.

Preferred examples of the bisphenol S or the bisphenol S derivative are as follows.

(Formula C-1)

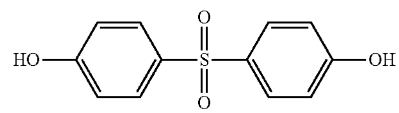

(Formula C-2)

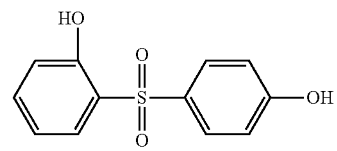

(Formula C-3)

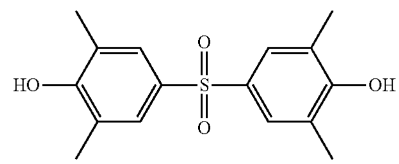

(Formula C-4)

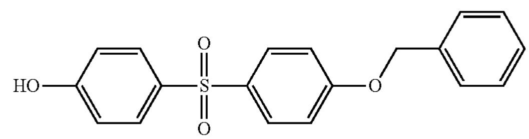

(Formula C-5)

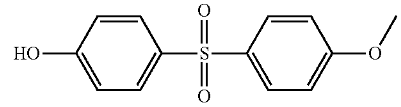

(Formula C-6)

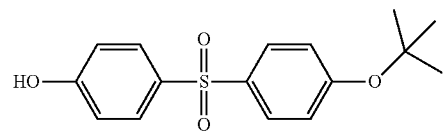

-continued (Formula C-7)

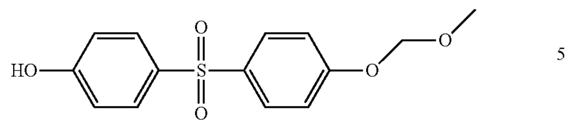

(Formula C-8)

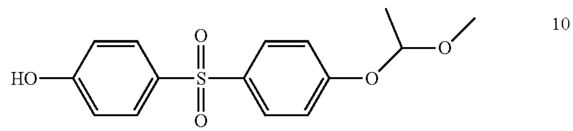

(Formula C-9)

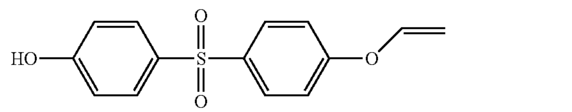

(Formula C-10)

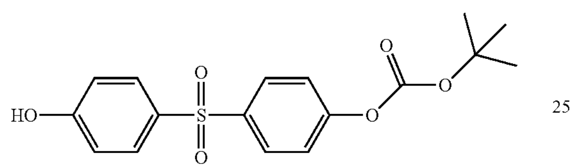

Formula (C-11)

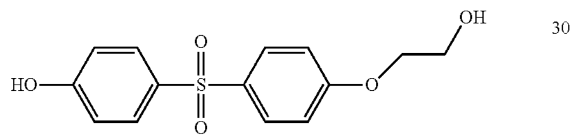

Formula (C-12)

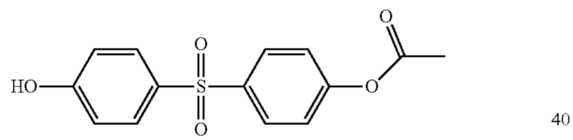

Formula (C-13)

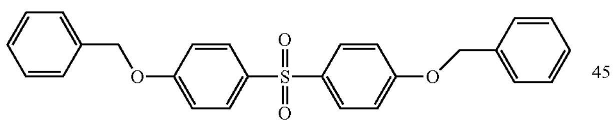

Formula (C-14)

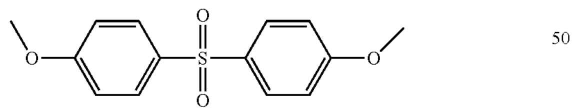

Formula (C-15)

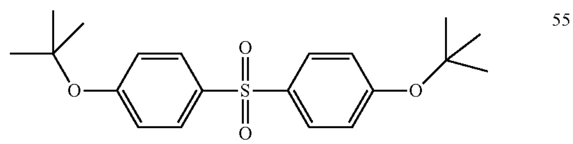

Formula (C-16)

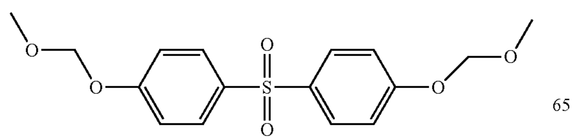

-continued

Formula (C-17)

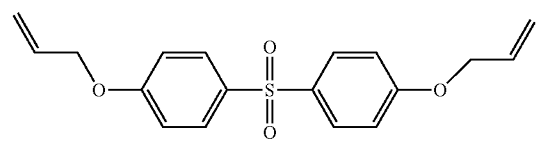

Formula (C-18)

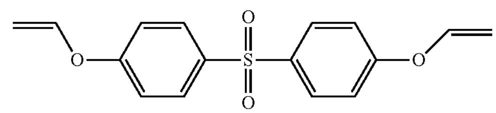

Formula (C-19)

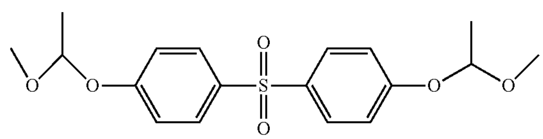

Formula (C-20)

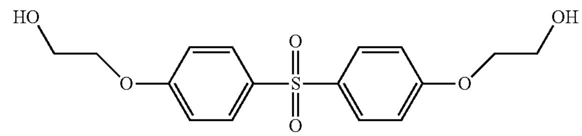

Formula (C-21)

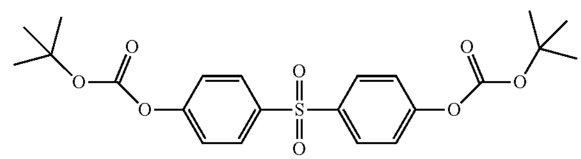

Formula (C-22)

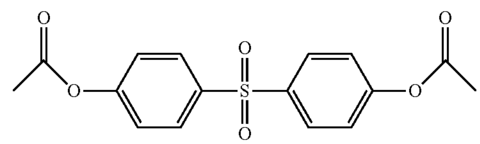

Formula (C-23)

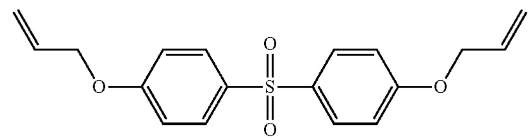

The composition for forming a resist underlayer film for lithography of the present invention may contain a curing catalyst. The curing catalyst plays its own role during heating and curing of a coating film containing a polyorganosiloxane composed of a hydrolytic condensate.

The curing catalyst may be an ammonium salt, a phosphine, a phosphonium salt, or a sulfonium salt.

Examples of the Ammonium Salt Include:

a quaternary ammonium salt having a structure of the following Formula (D-1):

Formula (D-1)

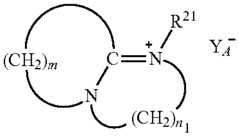

(wherein m is an integer of 2 to 11; $n_1$ is an integer of 2 or 3; $R^{21}$ is an alkyl group or an aryl group; and $Y_A^-$ is an anion);

a quaternary ammonium salt having a structure of the following Formula (D-2):

Formula (D-2)

$$R^{22}R^{23}R^{24}R^{25}N^+\ \ Y^-_A$$

(wherein $R^{22}$, $R^{23}$, $R^{24}$, and $R^{25}$ are each an alkyl group or an aryl group; N is a nitrogen atom; $Y_A^-$ is an anion; and each of $R^{22}$, $R^{23}$, $R^{24}$, and $R^{25}$ is bonded to the nitrogen atom via a C—N bond);

a quaternary ammonium salt having a structure of the following Formula (D-3):

Formula (D-3)

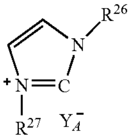

(wherein $R^{26}$ and $R^{27}$ are each an alkyl group or an aryl group; and $Y_A^-$ is an anion);

a quaternary ammonium salt having a structure of the following Formula (D-4):

Formula (D-4)

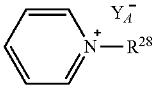

(wherein $R^{28}$ is an alkyl group or an aryl group; and $Y_A^-$ is an anion);

a quaternary ammonium salt having a structure of the following Formula (D-5):

Formula (D-5)

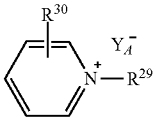

(wherein $R^{29}$ and $R^{30}$ are each an alkyl group or an aryl group; and $Y_A^-$ is an anion); and a tertiary ammonium salt having a structure of the following Formula (D-6):

Formula (D-6)

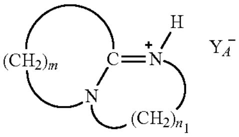

(wherein m is an integer of 2 to 11; $n_1$ is an integer of 2 or 3; H is a hydrogen atom; and $Y_A^-$ is an anion).

Examples of the phosphonium salt include a quaternary phosphonium salt of the following Formula (D-7):

Formula (D-7)

$$R^{31}R^{32}R^{33}R^{34}P^+\ \ Y^-_A$$

(wherein $R^{31}$, $R^{32}$, $R^{33}$, and $R^{34}$ are each an alkyl group or an aryl group; P is a phosphorus atom; $Y_A^-$ is an anion; and each of $R^{31}$, $R^{32}$, $R^{33}$, and $R^{34}$ is bonded to the phosphorus atom via a C—P bond).

Examples of the sulfonium salt include a tertiary sulfonium salt of the following Formula (D-8):

Formula (D-8)

$$R^{35}R^{36}R^{37}S^+\ \ Y^-_A$$

(wherein $R^{35}$, $R^{36}$, and $R^{37}$ are each an alkyl group or an aryl group; S is a sulfur atom; $Y_A^-$ is an anion; and each of $R^{35}$, $R^{36}$, and $R^{37}$ is bonded to the sulfur atom via a C—S bond).

The compound of Formula (D-1) is a quaternary ammonium salt derived from an amine. In Formula (D-1), m is an integer of 2 to 11, and $n_1$ is an integer of 2 or 3. $R^{21}$ of the quaternary ammonium salt is a $C_{1-18}$ alkyl or aryl group, preferably a $C_{2-10}$ alkyl or aryl group. Examples of $R^{21}$ include linear alkyl groups, such as ethyl group, propyl group, and butyl group, benzyl group, cyclohexyl group, cyclohexylmethyl group, and dicyclopentadienyl group. Examples of the anion ($Y_A^-$) include halide ions, such as chloride ion ($Cl^-$), bromide ion ($Br^-$), and iodide ion ($I^-$); and acid groups, such as carboxylate ($—COO^-$), sulfonate ($—SO_3^-$), and alcoholate ($—O^-$).

The compound of Formula (D-2) is a quaternary ammonium salt having a structure of $R^{22}R^{23}R^{24}R^{25}N^+Y_A^-$. $R^{22}$, $R^{23}$, $R^{24}$, and $R^{25}$ of the quaternary ammonium salt are each a $C_{1-18}$ alkyl or aryl group, or a silane compound bonded to the silicon atom via an Si—C bond. Examples of the anion ($Y_A^-$) include halide ions, such as chloride ion ($Cl^-$), bromide ion ($Br^-$), and iodide ion ($I^-$); and acid groups, such as carboxylate ($—COO^-$), sulfonate ($—SO_3^-$), and alcoholate ($—O^-$). The quaternary ammonium salt is commercially available, and examples of the quaternary ammonium salt include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. In Formula (D-3), $R^{26}$ and $R^{27}$ are each a $C_{1-18}$ group, and the total number of carbon atoms of $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion ($Y_A^-$) include halide ions, such as chloride ion ($Cl^-$), bromide ion ($Br^-$), and iodide ion (r); and acid groups, such as carboxylate (—$COO^-$), sulfonate (—$SO_3^-$), and alcoholate (—$O^-$). Although this compound is commercially available, the compound can be produced through, for example, reaction between an imidazole compound (e.g., 1-methylimidazole or 1-benzylimidazole) and an alkyl or aryl halide (e.g., benzyl bromide or methyl bromide).

The compound of Formula (D-4) is a quaternary ammonium salt derived from pyridine. In Formula (D-4), $R^{28}$ is a $C_{1-18}$ alkyl or aryl group, preferably a $C_{4-18}$ alkyl or aryl group. Examples of $R^{28}$ include butyl group, octyl group, benzyl group, and lauryl group. Examples of the anion ($Y_A^-$) include halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). Although this compound is commercially available, the compound can be produced through, for example, reaction between pyridine and an alkyl or aryl halide, such as lauryl chloride, benzyl chloride, benzyl bromide, methyl bromide, or octyl bromide. Examples of this compound include N-laurylpyridinium chloride and N-benzylpyridinium bromide.

The compound of Formula (D-5) is a quaternary ammonium salt derived from substituted pyridine, such as picoline. In Formula (D-5), $R^{29}$ is a $C_{1-18}$ alkyl or aryl group, preferably a $C_{4-18}$ alkyl or aryl group. Examples of $R^{29}$ include methyl group, octyl group, lauryl group, and benzyl group. $R^{30}$ is a $C_{1-18}$ alkyl or aryl group, and, for example, $R^{30}$ is a methyl group when the compound is a quaternary ammonium salt derived from picoline. Examples of the anion ($Y_A^-$) include halide ions, such as chloride ion ($Cl^-$), bromide ion ($Br^-$), and iodide ion (r); and acid groups, such as carboxylate (—$COO^-$), sulfonate (—$SO_3^-$), and alcoholate (—$O^-$). Although this compound is commercially available, the compound can be produced through, for example, reaction between substituted pyridine (e.g., picoline) and an alkyl or aryl halide, such as methyl bromide, octyl bromide, lauryl chloride, benzyl chloride, or benzyl bromide. Examples of this compound include N-benzylpicolinium chloride, N-benzylpicolinium bromide, and N-laurylpicolinium chloride.

The compound of Formula (D-6) is a tertiary ammonium salt derived from an amine. In Formula (D-6), m is an integer of 2 to 11, and n is an integer of 2 or 3. Examples of the anion ($Y_A^-$) include halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). The compound can be produced through, for example, reaction between an amine and a weak acid, such as a carboxylic acid or phenol. Examples of the carboxylic acid include formic acid and acetic acid. When formic acid is used, the anion ($Y_A^-$) is ($HCOO^-$). When acetic acid is used, the anion ($Y_A^-$) is ($CH_3COO^-$). When phenol is used, the anion ($Y_A^-$) is ($C_6H_5O^-$).

The compound of Formula (D-7) is a quaternary phosphonium salt having a structure of $R^{31}R^{32}R^{33}R^{34}P^+Y_A^-$. $R^{31}$, $R^{32}$, $R^{33}$, and $R^{34}$ are each a $C_{1-18}$ alkyl or aryl group, or a silane compound bonded to the silicon atom via an Si—C bond. Three of the four substituents $R^{31}$ to $R^{34}$ are preferably a phenyl group or a substituted phenyl group, such as a phenyl group or a tolyl group. The remaining one substituent is a $C_{1-18}$ alkyl or aryl group, or a silane compound bonded to the silicon atom via an Si—C bond. Examples of the anion ($Y_A^-$) include halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). This compound is commercially available, and examples of the compound include tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; triphenylbenzylphosphonium halides; tetraphenylphosphonium halides; tritolylmonoarylphosphonium halides; and tritolylmonoalkylphosphonium halides (wherein the halogen atom is a chlorine atom or a bromine atom). Particularly preferred are triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (wherein the halogen atom is a chlorine atom or a bromine atom).

Examples of the phosphine include primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) is a tertiary sulfonium salt having a structure of $R^{35}R^{36}R^{37}S^+Y_A^-$. $R^{35}$, $R^{36}$, and $R^{37}$ are each a $C_{1-18}$ alkyl or aryl group, or a silane compound bonded to the silicon atom via an Si—C bond. Three of the four substituents $R^{35}$ to $R^{37}$ are preferably a phenyl group or a substituted phenyl group, such as a phenyl group or a tolyl group. The remaining one substituent is a $C_{1-18}$ alkyl or aryl group. Examples of the anion ($Y_A^-$) include halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). This compound is commercially available, and examples of the compound include tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; triphenylsulfonium halides (wherein the halogen atom is a chlorine atom or a bromine atom); tetraalkylphosphonium carboxylates, such as tri-n-butylsulfonium carboxylate and tri-n-propylsulfonium carboxylate; trialkylbenzylsulfonium carboxylates, such as diethylbenzylsulfonium carboxylate; diphenylmonoalkylsulfonium carboxylates, such as diphenylmethylsulfonium carboxylate and diphenylethylsulfonium carboxylate; and triphenylsulfonium carboxylate. In particular, triphenylsulfonium halides and triphenylsulfonium carboxylate are preferred.

The amount of the curing catalyst is 0.01 parts by mass to 10 parts by mass, or 0.01 parts by mass to 5 parts by mass, or 0.01 parts by mass to 3 parts by mass relative to 100 parts by mass of the polyorganosiloxane.

From a hydrolytic condensate (polymer) prepared by hydrolysis and condensation of a hydrolyzable silane with a catalyst in a solvent, alcohols (i.e., by-products), the used hydrolysis catalyst, and water can be simultaneously removed by, for example, distillation under reduced pressure. Furthermore, an acid or base catalyst used in the hydrolysis can be removed by neutralization or ion exchange. In the case of the composition for forming a resist underlayer film for lithography of the present invention, an organic acid, water, an alcohol, or a combination thereof may be added to the resist underlayer film-forming composition containing the hydrolytic condensate for stabilization of the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Of these, oxalic acid, maleic acid, etc. are preferred. The amount of the organic acid added is 0.1 parts by mass to 5.0 parts by mass relative to 100 parts by mass of the condensate (polyorganosiloxane). For example, pure water, ultrapure water, or ion-exchange water may be added to the composition, and the amount of the water added may be 1 part by mass to 20 parts by mass relative to 100 parts by mass of the resist underlayer film-forming composition.

The alcohol added to the composition is preferably an alcohol that easily dissipates by heating after the application of the composition. Examples of the alcohol include methanol, ethanol, propanol, isopropanol, and butanol. The amount of the alcohol added may be 1 part by mass to 20 parts by mass relative to 100 parts by mass of the resist underlayer film-forming composition.

The composition for forming an underlayer film for lithography of the present invention may optionally contain, besides the aforementioned components, an organic polymer compound, a photoacid generator, and a surfactant, for example.

The use of an organic polymer compound enables adjustment of, for example, the dry etching rate (the amount of a reduction in film thickness per unit time), attenuation coefficient, and refractive index of a resist underlayer film formed from the composition for forming an underlayer film for lithography of the present invention.

No particular limitation is imposed on the organic polymer compound, and a variety of organic polymers may be used. For example, a polycondensation polymer and an addition polymerization polymer may be used. Examples of the usable addition polymerization polymer and polycondensation polymer include polyester, polystyrene, polyimide, acrylic polymer, methacrylic polymer, polyvinyl ether, phenol novolac, naphthol novolac, polyether, polyamide, and polycarbonate. Preferred is an organic polymer having an aromatic ring structure that functions as a light-absorbing moiety, such as a benzene ring, a naphthalene ring, an anthracene ring, a triazine ring, a quinoline ring, and a quinoxaline ring.

Examples of such an organic polymer compound include addition polymerization polymers including, as a structural unit thereof, addition polymerizable monomers, such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide; and polycondensation polymers, such as phenol novolac and naphthol novolac.

When the organic polymer compound is an addition polymerization polymer, the polymer compound may be a homopolymer or a copolymer. An addition polymerizable monomer is used for the production of the addition polymerization polymer. Examples of such an addition polymerizable monomer include acrylic acid, methacrylic acid, an acrylic ester compound, a methacrylic ester compound, an acrylamide compound, a methacrylamide compound, a vinyl compound, a styrene compound, a maleimide compound, maleic anhydride, and acrylonitrile.

When the organic polymer compound is a polycondensation polymer, the polymer is, for example, a polycondensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride.

Examples of the polycondensation polymer include polyesters, polyamides, and polyimides, such as polypyromellitic imide, poly(p-phenyleneterephthalamide), polybutylene terephthalate, and polyethylene terephthalate.

When the organic polymer compound contains a hydroxyl group, this hydroxyl group can cause a crosslinking reaction with a polyorganosiloxane.

The organic polymer compound may be a polymer compound having a weight average molecular weight of, for example, 1,000 to 1,000,000, or 3,000 to 300,000, or 5,000 to 200,000, or 10,000 to 100,000.

A single organic polymer compound may be used alone, or two or more organic polymer compounds may be used in combination.

When the organic polymer compound is used, the amount thereof is 1 part by mass to 200 parts by mass, or 5 parts by mass to 100 parts by mass, or 10 parts by mass to 50 parts by mass, or 20 parts by mass to 30 parts by mass relative to 100 parts by mass of the condensate (polyorganosiloxane).

A surfactant effectively suppresses formation of, for example, pinholes and striations during application of the composition for forming a resist underlayer film for lithography of the present invention to a substrate.

Examples of the surfactant contained in the resist underlayer film-forming composition of the present invention include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as trade names EFTOP EF301, EF303, and EF352 (available from Tohkem Products Corporation), trade names MEGAFAC F171, F173, R-08, and R-30 (available from Dainippon Ink and Chemicals, Inc.), Fluorad FC430 and FC431 (available from Sumitomo 3M Limited), trade name Asahi Guard AG710 and trade names SURFLON S-382, SC101, SC102, SC103, SC104, SC105, and SC106 (available from Asahi Glass Co., Ltd.); and Organosiloxane Polymer KP341 (available from Shin-Etsu Chemical Co., Ltd.). These surfactants may be used alone or in combination of two or more species. When the surfactant is used, the amount thereof is 0.0001 parts by mass to 5 parts by mass, or 0.001 parts by mass to 1 part by mass, or 0.01 parts by mass to 0.5 parts by mass relative to 100 parts by mass of the condensate (polyorganosiloxane).

The resist underlayer film-forming composition of the present invention may also contain, for example, a rheology controlling agent and an adhesion aid. A rheology controlling agent is effective for improving the fluidity of the underlayer film-forming composition. An adhesion aid is effective for improving the adhesion between a semiconductor substrate or a resist and an underlayer film.

No particular limitation is imposed on the solvent used in the resist underlayer film-forming composition of the present invention, so long as the solvent can dissolve the aforementioned solid component. Examples of such a solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, methyl propyl ketone, methyl butyl ketone, 2-heptanone, 3-heptanone, 4-heptanone, N,N-dimethylformamide, N-methylacetamide, N,N-dimethylacetamide, N-methylpyrrolidone, 4-methyl-2-pentanol, and γ-butyrolactone. These solvents may be used alone or in combination of two or more species.

Next will be described the use of the resist underlayer film-forming composition of the present invention.

The resist underlayer film-forming composition of the present invention is applied onto a substrate used for the production of a semiconductor device (e.g., a silicon wafer substrate, a silicon/silicon dioxide-coated substrate, a silicon nitride substrate, a glass substrate, an ITO substrate, a polyimide substrate, or a substrate coated with a low dielectric constant material (low-k material)) by an appropriate application method with, for example, a spinner or a coater, followed by baking of the composition, to thereby form a resist underlayer film. The baking is performed under appropriately determined conditions; i.e., a baking temperature of 80° C. to 250° C. and a baking time of 0.3 minutes to 60 minutes. Preferably, the baking temperature is 150° C. to 250° C., and the baking time is 0.5 minutes to 2 minutes. The thickness of the thus-formed underlayer film is, for example, 10 nm to 1,000 nm, or 20 nm to 500 nm, or 50 nm to 300 nm, or 100 nm to 200 nm.

Subsequently, for example, a photoresist layer is formed on the resist underlayer film. The photoresist layer can be formed by a well-known process; i.e., application of a photoresist composition solution onto the underlayer film, and baking of the composition. The thickness of the photoresist layer is, for example, 50 nm to 10,000 nm, or 100 nm to 2,000 nm, or 200 nm to 1,000 nm.

In the present invention, an organic underlayer film can be formed on a substrate, the resist underlayer film of the present invention can then be formed on the organic underlayer film, and then the resist underlayer film can be coated with a photoresist. This process can narrow the pattern width of the photoresist. Thus, even when the photoresist is applied thinly for preventing pattern collapse, the substrate can be processed through selection of an appropriate etching gas. For example, the resist underlayer film of the present invention can be processed by using, as an etching gas, a fluorine-containing gas that achieves a significantly high etching rate for the photoresist. The organic underlayer film can be processed by using, as an etching gas, an oxygen-containing gas that achieves a significantly high etching rate for the resist underlayer film of the present invention. The substrate can be processed by using, as an etching gas, a fluorine-containing gas that achieves a significantly high etching rate for the organic underlayer film.

No particular limitation is imposed on the photoresist formed on the resist underlayer film of the present invention, so long as the photoresist is sensitive to light used for exposure. The photoresist may be either of negative and positive photoresists. Examples of the photoresist include a positive photoresist formed of a novolac resin and a 1,2-naphthoquinone diazide sulfonic acid ester; a chemically amplified photoresist formed of a binder having a group that decomposes with an acid to thereby increase an alkali dissolution rate and a photoacid generator; a chemically amplified photoresist formed of a low-molecular-weight compound that decomposes with an acid to thereby increase the alkali dissolution rate of the photoresist, an alkali-soluble binder, and a photoacid generator; and a chemically amplified photoresist formed of a binder having a group that decomposes with an acid to thereby increase an alkali dissolution rate, a low-molecular-weight compound that decomposes with an acid to thereby increase the alkali dissolution rate of the photoresist, and a photoacid generator. Specific examples of the photoresist include trade name APEX-E, available from Shipley, trade name PAR710, available from Sumitomo Chemical Company, Limited, and trade name SEPR430, available from Shin-Etsu Chemical Co., Ltd. Other examples of the photoresist include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Subsequently, light exposure is performed through a predetermined mask. The light exposure may involve the use of, for example, a KrF excimer laser (wavelength: 248 nm), an ArF excimer laser (wavelength: 193 nm), and an F2 excimer laser (wavelength: 157 nm). After the light exposure, post exposure bake may optionally be performed. The post exposure bake is performed under appropriately determined conditions; i.e., a heating temperature of 70° C. to 150° C. and a heating time of 0.3 minutes to 10 minutes.

In the present invention, a resist for electron beam lithography or a resist for EUV lithography may be used instead of the photoresist. The electron beam resist may be either of negative and positive resists. Examples of the electron beam resist include a chemically amplified resist formed of an acid generator and a binder having a group that decomposes with an acid to thereby change an alkali dissolution rate; a chemically amplified resist formed of an alkali-soluble binder, an acid generator, and a low-molecular-weight compound that decomposes with an acid to thereby change the alkali dissolution rate of the resist; a chemically amplified resist formed of an acid generator, a binder having a group that decomposes with an acid to thereby change an alkali dissolution rate, and a low-molecular-weight compound that decomposes with an acid to thereby change the alkali dissolution rate of the resist; a non-chemically amplified resist formed of a binder having a group that decomposes with electron beams to thereby change an alkali dissolution rate; and a non-chemically amplified resist formed of a binder having a moiety that is cut with electron beams to thereby change an alkali dissolution rate. Also in the case of use of such an electron beam resist, a resist pattern can be formed by using electron beams as an irradiation source in the same manner as in the case of using the photoresist.

The EUV resist may be a methacrylate resin-based resist.

Subsequently, development is performed with a developer (e.g., an alkaline developer). When, for example, a positive photoresist is used, an exposed portion of the photoresist is removed to thereby form a pattern of the photoresist.

Examples of the developer include alkaline aqueous solutions, for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine. Such a developer may also contain, for example, a surfactant. The development is performed under appropriately determined conditions; i.e., a temperature of 5° C. to 50° C. and a time of 10 seconds to 600 seconds.

The thus-formed photoresist pattern (upper layer) and the resist underlayer film (intermediate layer) of the present invention are removed by using the alkaline developer in accordance with the resist pattern. Subsequently, the patterned photoresist and the patterned resist underlayer film (intermediate layer) of the present invention are used as protective films for removing the organic underlayer film (lower layer). Finally, the patterned resist underlayer film (intermediate layer) of the present invention and the patterned organic underlayer film (lower layer) are used as protective films for processing the semiconductor substrate.

Firstly, the photoresist pattern and the resist underlayer film (intermediate layer) of the present invention are removed by using the alkaline developer in accordance with the resist pattern, and then the lower layer is processed.

The patterned photoresist and the patterned resist underlayer film of the present invention are used as protective films for removing the organic underlayer film. The dry etching of the organic underlayer film (lower layer) is preferably performed with an oxygen-containing gas, since the resist underlayer film of the present invention, which contains numerous silicon atoms, is less likely to be removed by dry etching with an oxygen-containing gas.

Finally, the semiconductor substrate is processed. The processing of the semiconductor substrate is preferably performed by dry etching with a fluorine-containing gas.

Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

After the processing of the substrate, the resist underlayer film remaining on the substrate and used for the substrate processing can be removed with an alkaline aqueous solution. The alkaline aqueous solution may be, for example, an aqueous tetramethylammonium hydroxide solution or an aqueous tetraethylammonium hydroxide solution.

The alkaline aqueous solution may be used at a concentration of 2.38% by mass. Alternatively, the alkaline aqueous solution may be used at a high concentration of 10% by mass, 20% by mass, or 30% by mass.

The substrate to which the resist underlayer film-forming composition of the present invention is applied may have an organic or inorganic anti-reflective coating formed thereon by, for example, a CVD process. The underlayer film of the present invention may be formed on the anti-reflective coating.

The resist underlayer film formed from the resist underlayer film-forming composition of the present invention may absorb light used in a lithography process depending on the wavelength of the light. In such a case, the resist underlayer film can function as an anti-reflective coating having the effect of preventing reflection of light from the substrate. Furthermore, the underlayer film of the present invention can be used as, for example, a layer for preventing the interaction between the substrate and the photoresist; a layer having the function of preventing the adverse effect, on the substrate, of a material used for the photoresist or a substance generated during the exposure of the photoresist to light; a layer having the function of preventing diffusion of a substance generated from the substrate during heating and baking to the photoresist serving as an upper layer; and a barrier layer for reducing a poisoning effect of a dielectric layer of the semiconductor substrate on the photoresist layer.

The resist underlayer film formed from the resist underlayer film-forming composition can be applied to a substrate having via holes for use in a dual damascene process, and can be used as an embedding material to fill up the holes. The resist underlayer film can also be used as a planarization material for planarizing the surface of a semiconductor substrate having irregularities.

The resist underlayer film can function not only as a hard mask, but also be as an EUV resist underlayer film for the purpose described below. Specifically, the resist underlayer film-forming composition can be used for an anti-reflective EUV resist underlayer coating capable of, without intermixing with an EUV resist, preventing the reflection, from a substrate or an interface, of exposure light undesirable for EUV exposure (wavelength: 13.5 nm); for example, the aforementioned UV or DUV (ArF laser light, KrF laser light). Thus, the reflection can be efficiently prevented in the underlayer of the EUV resist. When the resist underlayer film is used as an EUV resist underlayer film, the film can be processed in the same manner as in the photoresist underlayer film.

EXAMPLES

Synthesis Example 1

A 300-ml flask was charged with 20.0 g of tetraethoxysilane, 1.5 g of phenyltrimethoxysilane, 14.6 g of 5-(triethoxysilyl)hexahydro-4,7-methanoisobenzofuran-1,3-dione, and 54.2 g of acetone. While the resultant mixture was stirred with a magnetic stirrer, 9.7 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 72 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to Formula (4-1). The polymer was found to have a weight average molecular weight Mw of 1,500 as determined by GPC in terms of polystyrene. 5-(triethoxysilyl)hexahydro-4,7-methanoisobenzofuran-1,3-dione was contained in an amount of 30% by mole in the entire silane.

Synthesis Example 2

A 300-ml flask was charged with 19.5 g of tetraethoxysilane, 14.2 g of 5-(triethoxysilyl)hexahydro-4,7-methanoisobenzofuran-1,3-dione, 2.6 g of N-(3-(triethoxysilyl)propyl)benzenesulfonamide, and 54.3 g of acetone. While the resultant mixture was stirred with a magnetic stirrer, 9.5 g of 0.1 M aqueous nitric acid solution was added dropwise to the mixture. After completion of the dropwise addition, the flask was transferred to an oil bath set at 85° C., and the mixture was refluxed for 240 minutes. Thereafter, 72 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to Formula (4-2). The polymer was found to have a weight average molecular weight Mw of 1,500 as determined by GPC in terms of polystyrene. 5-(triethoxysilyl)hexahydro-4,7-methanoisobenzofuran-1,3-dione was contained in an amount of 30% by mole in the entire silane.

Synthesis Example 3

A 300-ml flask was charged with 18.2 g of tetraethoxysilane, 16.9 g of di-tert-butyl 2-(3-(triethoxysilyl)propyl)malonate, 1.33 g of phenyltrimethoxysilane, and 54.7 g of acetone. While the resultant mixture was stirred with a magnetic stirrer, 8.8 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 72 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to Formula (4-3). The polymer was found to have a weight average molecular weight Mw of 1,500 as determined by GPC in terms of polystyrene. Di-tert-butyl 2-(3-(triethoxysilyl)propyl)malonate was contained in an amount of 30% by mole in the entire silane.

Synthesis Example 4

A 300-ml flask was charged with 17.7 g of tetraethoxysilane, 16.5 g of di-tert-butyl 2-(3-(triethoxysilyl)propyl)malonate, 2.4 g of N-(3-(triethoxysilyl)propyl)benzenesulfonamide, and 54.8 g of acetone. While the resultant mixture was stirred with a magnetic stirrer, 8.8 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 72 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to Formula (4-4). The polymer was found to have a weight average molecular weight Mw of 1,500 as determined by GPC in terms of polystyrene. Di-tert-butyl 2-(3-(triethoxysilyl)propyl)malonate was contained in an amount of 30% by mole in the entire silane.

Synthesis Example 5

A 300-ml flask was charged with 20.6 g of tetraethoxysilane, 13.9 g of 3-(3-(triethoxysilyl)propyl)dihydrofuran-2,5-dione, 1.51 g of phenyltrimethoxysilane, and 54.0 g of acetone. While the resultant mixture was stirred with a magnetic stirrer, 10.0 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 72 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to Formula (4-5). The polymer was found to have a weight average molecular weight Mw of 1,500 as determined by GPC in terms of polystyrene. 3-(3-(triethoxysilyl)propyl)dihydrofuran-2,5-dione was contained in an amount of 30% by mole in the entire silane.

Synthesis Example 6

A 300-ml flask was charged with 20.0 g of tetraethoxysilane, 13.5 g of 3-(3-(triethoxysilyl)propyl)dihydrofuran-2,5-dione, 2.67 g of N-(3-(triethoxysilyl)propyl)benzenesulfonamide, and 54.2 g of acetone. While the resultant mixture was stirred with a magnetic stirrer, 9.7 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 72 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to Formula (4-6). The polymer was found to have a weight average molecular weight Mw of 1,500 as determined by GPC in terms of polystyrene. 3-(3-(triethoxysilyl)propyl)dihydrofuran-2,5-dione was contained in an amount of 30% by mole in the entire silane.

Synthesis Example 7

A 300-ml flask was charged with 12.8 g of tetraethoxysilane, 22.4 g of 5-(triethoxysilyl)hexahydro-4,7-methanoisobenzofuran-1,3-dione, 1.35 g of phenyltrimethoxysilane, and 54.9 g of acetone. While the resultant mixture was stirred with a magnetic stirrer, 8.5 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 72 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to Formula (4-7). The polymer was found to have a weight average molecular weight Mw of 1,500 as determined by GPC in terms of polystyrene. 5-(triethoxysilyl)hexahydro-4,7-methanoisobenzofuran-1,3-dione was contained in an amount of 50% by mole in the entire silane.

Synthesis Example 8

A 300-ml flask was charged with 17.2 g of tetraethoxysilane, 13.5 g of 5-(triethoxysilyl)hexahydro-4,7-methanoisobenzofuran-1,3-dione, 5.69 g of triethoxysilylpropyldiallyl isocyanurate, and 54.6 g of acetone. While the resultant mixture was stirred with a magnetic stirrer, 8.9 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 72 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to Formula (4-8). The polymer was found to have a weight average molecular weight Mw of 1,500 as determined by GPC in terms of polystyrene. 5-(triethoxysilyl)hexahydro-4,7-methanoisobenzofuran-1,3-dione was contained in an amount of 30% by mole in the entire silane.

Synthesis Example 9

A 300-ml flask was charged with 0.81 g of 35 wt % aqueous tetraethylammonium hydroxide solution, 1.30 g of water, 27.63 g of isopropyl alcohol, and 55.25 g of methyl isobutyl ketone. While the resultant mixture was stirred with a magnetic stirrer, 27.6 g of (4-(1-ethoxyethoxy)phenyl) trimethoxysilane was added dropwise to the mixture. After completion of the dropwise addition, the flask was transferred to an oil bath set at 40° C., and reaction was allowed to proceed for 240 minutes. Thereafter, 48.2 g of 1 M nitric acid was added to the reaction mixture, and the ethoxyethoxy group was deprotected at 40° C., to thereby prepare a hydrolytic condensate having a phenol group. Subsequently, 165.76 g of methyl isobutyl ketone and 82.88 g of water were added to the condensate, followed by phase separation. Water, nitric acid, and tetraethylammonium nitrate, which were reaction by-products transferred to an aqueous phase by the phase separation, were then distilled off to thereby recover an organic phase. Thereafter, 82.88 g of propylene glycol monomethyl ether was added, and methyl isobutyl ketone, methanol, ethanol, and water were distilled off under reduced pressure, followed by concentration, to thereby prepare an aqueous solution of a hydrolytic condensate (polymer). Subsequently, propylene glycol monomethyl ether was added so as to achieve a solvent proportion of propylene glycol monomethyl ether 100% and a solid residue content of 20% by mass at 140° C. The resultant polymer corresponds to Formula (4-9). The polymer was found to have a weight average molecular weight Mw of 2,500 as determined by GPC in terms of polystyrene. A phenol group-containing unit prepared through deprotection of the ethoxyethoxy group of (4-(1-ethoxyethoxy)phenyl)trimethoxysilane was contained in an amount of 100% by mole in the entire silane.

Synthesis Example 10

A 300-ml flask was charged with 0.78 g of 35 wt % aqueous tetraethylammonium hydroxide solution, 1.24 g of water, 27.34 g of isopropyl alcohol, and 54.67 g of methyl isobutyl ketone. While the resultant mixture was stirred with a magnetic stirrer, 27.34 g of 5-(triethoxysilyl)hexahydro-4,7-methanoisobenzofuran-1,3-dione and 2.65 g of (4-(1-ethoxyethoxy)phenyl)trimethoxysilane were added dropwise to the mixture. After completion of the dropwise addition, the flask was transferred to an oil bath set at 40° C., and reaction was allowed to proceed for 240 minutes. Thereafter, 46.2 g of 1 M nitric acid was added to the reaction mixture, and the ethoxyethoxy group was deprotected at 40° C., to thereby prepare a hydrolytic condensate having a phenol group and a dicarboxylic acid group. Subsequently, 164.0 g of methyl isobutyl ketone and 82.0 g of water were added to the condensate, followed by phase separation. Water, nitric acid, and tetraethylammonium nitrate, which were reaction by-products transferred to an aqueous phase by the phase separation, were then distilled off to thereby recover an organic phase. Thereafter, 82.0 g of propylene glycol monomethyl ether was added, and methyl isobutyl ketone, methanol, ethanol, and water were distilled off under reduced pressure, followed by concentration, to thereby prepare an aqueous solution of a hydrolytic condensate (polymer). Subsequently, propylene glycol monomethyl ether was added so as to achieve a solvent proportion of propylene glycol monomethyl ether 100% and a solid residue content of 20% by mass at 140° C. The resultant polymer corresponds to Formula (4-10). The polymer was found to have a weight average molecular weight Mw of 2,000 as determined by GPC in terms of polystyrene. A phenol group-containing unit prepared through deprotection of the ethoxyethoxy group of (4-(1-ethoxyethoxy)phenyl) trimethoxysilane was contained in an amount of 10% by mole in the entire silane, and a dicarboxylic acid-containing unit prepared through hydrolysis of 5-(triethoxysilyl)hexahydro-4,7-methanoisobenzofuran-1,3-dione was contained in an amount of 90% by mole in the entire silane.

Synthesis Example 11

A 300-ml flask was charged with 0.86 g of 35 wt % aqueous tetraethylammonium hydroxide solution, 1.38 g of water, 28.15 g of isopropyl alcohol, and 56.30 g of methyl isobutyl ketone. While the resultant mixture was stirred with a magnetic stirrer, 28.15 g of 3-(3-(triethoxysilyl)propyl) dihydrofuran-2,5-dione and 2.94 g of (4-(1-ethoxyethoxy) phenyl)trimethoxysilane were added dropwise to the mixture. After completion of the dropwise addition, the flask was transferred to an oil bath set at 40° C., and reaction was allowed to proceed for 240 minutes. Thereafter, 51.4 g of 1 M nitric acid was added to the reaction mixture, and the ethoxyethoxy group was deprotected at 40° C., to thereby prepare a hydrolytic condensate having a phenol group and a dicarboxylic acid group. Subsequently, 168.9 g of methyl isobutyl ketone and 84.5 g of water were added to the condensate, followed by phase separation. Water, nitric acid, and tetraethylammonium nitrate, which were reaction by-products transferred to an aqueous phase by the phase separation, were then distilled off to thereby recover an organic phase. Thereafter, 84.5 g of propylene glycol monomethyl ether was added, and methyl isobutyl ketone, methanol, ethanol, and water were distilled off under reduced pressure, followed by concentration, to thereby prepare an aqueous solution of a hydrolytic condensate (polymer). Subsequently, propylene glycol monomethyl ether was added so as to achieve a solvent proportion of propylene glycol monomethyl ether 100% and a solid residue content of 20% by mass at 140° C. The resultant polymer corresponds to Formula (4-11). The polymer was found to have a weight average molecular weight Mw of 2,100 as determined by GPC in terms of polystyrene. A phenol group-containing unit prepared through deprotection of the ethoxyethoxy group of (4-(1-ethoxyethoxy)phenyl) trimethoxysilane was contained in an amount of 10% by mole in the entire silane, and a dicarboxylic acid-containing unit prepared through hydrolysis of 3-(3-(triethoxysilyl) propyl)dihydrofuran-2,5-dione was contained in an amount of 90% by mole in the entire silane.

Comparative Synthesis Example 1

A 300-ml flask was charged with 24.1 g of tetraethoxysilane, 1.8 g of phenyltrimethoxysilane, 9.5 g of triethoxymethylsilane, and 53.0 g of acetone. While the resultant mixture was stirred with a magnetic stirrer, 11.7 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 70 g of propylene glycol monomethyl ether was added to the mixture, and then acetone, methanol, ethanol, and water were distilled off under reduced pressure, followed by concentration, to thereby prepare an aqueous solution of a hydrolytic condensate (polymer). Subsequently, propylene glycol monomethyl ether was added to the aqueous solution so as to achieve a solid residue content of 13% by mass at 140° C. The resultant polymer corresponds to the following Formula (5-1). The polymer was found to have a weight average molecular weight Mw of 1,400 as determined by GPC in terms of polystyrene.

Formula (5-1)

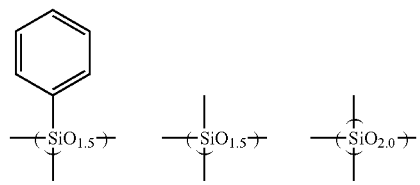

Preparation of Si-Containing Resist Underlayer Film

The silicon-containing polymer prepared above in Synthesis Example 1, an acid, and a solvent were mixed in proportions shown in Tables 1 and 2, and the resultant mixture was filtered with a fluororesin-made filter (0.1 μm), to thereby prepare a polymer-containing coating liquid. The amount of the polymer shown in Tables 1 and 2 corresponds not to the amount of the polymer solution, but to the amount of the polymer itself.

TPSMale (photoacid generator) denotes triphenylsulfonium maleate; TPSNO3 (photoacid generator), triphenylsulfonium nitrate; TPSCS (photoacid generator), triphenylsulfonium camphorsulfonate; TPSTFA (photoacid generator), triphenylsulfonium trifluoroacetate; TPSNf (photoacid generator), triphenylsulfonium nonafluorobutanesulfonate; TPSTf (photoacid generator), triphenylsulfonium trifluoromethanesulfonate; TPSAdTf (photoacid generator), triphenylsulfonium adamantanecarboxylate butyl trifluoromethanesulfonate; ImideTEOS, 4,5-dihydroimidazolepropyltriethoxysilane; TPSC1 (photoacid generator), triphenylsulfonium chloride; TPSAc (photoacid generator), triphenylsulfonium acetate; TPSMS (photoacid generator), trifluoromethanesulfonium methanesulfonate; Tris-VE, tris (4-(vinyloxy)butyl)benzene-1,3,5-tricarboxylate; PGME, propylene glycol monomethyl ether; and PGMEA, propylene glycol monomethyl ether acetate. The amount of each component is represented by "parts by mass."

TABLE 1

| | Si polymer | Additive 1 | Additive 2 | Additive 3 | Solvent | |
|---|---|---|---|---|---|---|
| Example 1 | Synthesis Example 1 | Maleic acid | TPSMale | | PGME | PGMEA |
| (parts by mass) | 2 | 0.06 | 0.06 | | 70 | 30 |
| Example 2 | Synthesis Example 2 | Maleic acid | TPSNO3 | TPSCS | PGME | PGMEA |
| (parts by mass) | 2 | 0.06 | 0.06 | 0.1 | 70 | 30 |
| Example 3 | Synthesis Example 3 | Maleic acid | TPSTFA | TPSNf | PGME | PGMEA |
| (parts by mass) | 2 | 0.06 | 0.06 | 0.1 | 70 | 30 |
| Example 4 | Synthesis Example 4 | Maleic acid | TPSNO3 | TPSAdTf | PGME | PGMEA |
| (parts by mass) | 2 | 0.06 | 0.06 | 0.1 | 70 | 30 |
| Example 5 | Synthesis Example 5 | Maleic acid | ImideTEOS | | PGME | PGMEA |
| (parts by mass) | 2 | 0.06 | 0.06 | | 70 | 30 |

TABLE 1-continued

| | Si polymer | Additive 1 | Additive 2 | Additive 3 | Solvent | |
|---|---|---|---|---|---|---|
| Example 6 | Synthesis Example 6 | Maleic acid | TPSCl | | PGME | PGMEA |
| (parts by mass) | 2 | 0.06 | 0.06 | | 70 | 30 |
| Example 7 | Synthesis Example 7 | Maleic acid | TPSAc | | PGME | PGMEA |
| (parts by mass) | 2 | 0.06 | 0.06 | | 70 | 30 |

TABLE 2

| | Si polymer | Additive 1 | Additive 2 | Additive 3 | Solvent | |
|---|---|---|---|---|---|---|
| Example 8 | Synthesis Example 8 | Maleic acid | TPSNO3 | | PGME | PGMEA |
| (parts by mass) | 2 | 0.06 | 0.06 | | 70 | 30 |
| Example 9 | Synthesis Example 9 | Tris-VE | TPSTf | ImideTEOS | PGME | PGMEA |
| (parts by mass) | 2 | 0.6 | 0.6 | 0.2 | 70 | 30 |
| Example 10 | Synthesis Example 10 | Tris-VE | TPSTf | ImideTEOS | PGME | PGMEA |
| (parts by mass) | 2 | 0.6 | 0.6 | 0.2 | 70 | 30 |
| Example 11 | Synthesis Example 11 | Tris-VE | TPSTf | ImideTEOS | PGME | PGMEA |
| (parts by mass) | 2 | 0.6 | 0.6 | 0.2 | 70 | 30 |
| Comparative Example 1 | Comparative Synthesis Example 1 | Maleic acid | TPSMS | | PGME | PGMEA |
| (parts by mass) | 2 | 0.06 | 0.06 | | 70 | 30 |
| Comparative Example 2 | Comparative Synthesis Example 1 | Maleic acid | TPSNO3 | | PGME | PGMEA |
| (parts by mass) | 2 | 0.06 | 0.06 | | 70 | 30 |

Preparation of Organic Underlayer Film

In a nitrogen atmosphere, a 100-mL four-necked flask was charged with 6.69 g (0.040 mol) of carbazole (available from Tokyo Chemical Industry Co., Ltd.), 7.28 g (0.040 mol) of 9-fluorenone (available from Tokyo Chemical Industry Co., Ltd.), 0.76 g (0.0040 mol) of p-toluenesulfonic acid monohydrate (available from Tokyo Chemical Industry Co., Ltd.), and 6.69 g of 1,4-dioxane (available from Kanto Chemical Co., Inc.), and the resultant mixture was stirred. The mixture was heated to 100° C. for dissolution, to thereby initiate polymerization. After the elapse of 24 hours, the mixture was left to cool to 60° C. The mixture was then diluted with 34 g of chloroform (available from Kanto Chemical Co., Inc.) and reprecipitated in 168 g of methanol (available from Kanto Chemical Co., Inc.). The resultant precipitate was filtered and dried with a reduced pressure dryer at 80° C. for 24 hours, to thereby yield 9.37 g of an intended polymer (Formula (6-1), hereinafter abbreviated as "PCzFL").

Formula (6-1)

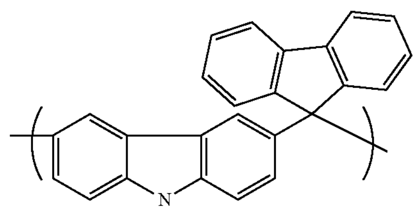

The results of $^{1}$H-NMR analysis of PCzFL were as follows:

$^{1}$H-NMR (400 MHz, DMSO-$d_6$): δ7.03-7.55 (br, 12H), δ7.61-8.10 (br, 4H), δ11.18 (br, 1H).

PCzFL was found to have a weight average molecular weight Mw of 2,800 as determined by GPC in terms of polystyrene and a polydispersity Mw/Mn of 1.77.

Subsequently, 20 g of the resultant resin was mixed with 3.0 g of tetramethoxymethyl glycoluril (trade name: Powderlink 1174, available from Mitsui Cytec Ltd.) serving as a crosslinking agent, 0.30 g of pyridinium p-toluenesulfonate serving as a catalyst, and 0.06 g of MEGAFAC R-30 (trade name, available from DIC Corporation) serving as a surfactant, and the mixture was dissolved in 88 g of propylene glycol monomethyl ether acetate, to thereby prepare a solution. Thereafter, the solution was filtered with a polyethylene-made microfilter (pore size: 0.10 μm), and then filtered with a polyethylene-made microfilter (pore size: 0.05 μm), to thereby prepare a solution of a composition for forming an organic underlayer film used for a lithography process using a multilayer film.

(Tests for Solvent Resistance and Developer Solubility)

Each of the Si-containing coating liquids prepared in Examples 1 to 11 and Comparative Example 1 was applied onto a silicon wafer with a spinner. The silicon wafer was heated on a hot plate at 180° C. for one minute, to thereby form an Si-containing resist underlayer film. Thereafter, a solvent of propylene glycol monomethyl ether/propylene glycol monomethyl ether acetate (=7/3) was applied onto the Si-containing resist underlayer film and then spin-dried for determining a change in film thickness between before and after application of the solvent. Solvent resistance was evaluated as "Good" when a change in film thickness was 1% or less, or evaluated as "Not cured" when a change in film thickness was 1% or more.

Similarly, each of the Si-containing coating liquids prepared in Examples 1 to 11 and Comparative Example 1 was applied onto a silicon wafer with a spinner. The silicon wafer was heated on a hot plate at 180° C. for one minute, to thereby form an Si-containing resist underlayer film. Thereafter, an alkaline developer (2.38% aqueous tetramethylammonium hydroxide (TMAH) solution) was applied onto the Si-containing resist underlayer film and then spin-dried for determining a change in film thickness between before and after application of the solvent. Developer solubility was evaluated as "Good" when a change in film thickness was 90% or more, or evaluated as "Not dissolved" when a change in film thickness was 90% or less.

Similarly, each of the Si-containing coating liquids prepared in Examples 1 to 11 and Comparative Example 1 was applied onto a silicon wafer with a spinner. The silicon wafer was heated on a hot plate at 180° C. for one minute, to thereby form an Si-containing resist underlayer film. Subsequently, the entire surface of the Si wafer was exposed (not through a mask) to ArF light by using a scanner NSR-5307E (available from Nikon Corporation) (wavelength: 193 nm, NA, a: 0.85). Thereafter, an alkaline developer (2.38% aqueous TMAH solution) was applied onto the Si-containing resist underlayer film and then spin-dried for determining a change in film thickness between before and after application of the solvent. Developer solubility was evaluated as "Good" when a change in film thickness was 90% or more, or evaluated as "Not dissolved" when a change in film thickness was 90% or less. In the following table, "—" represents no evaluation.

TABLE 3

| | Solvent resistance | Developer solubility (before light exposure) | Developer solubility (after light exposure) |
|---|---|---|---|
| Example 1 | Good | Good | Good |
| Example 2 | Good | Good | Good |
| Example 3 | Good | Not dissolved | Good |
| Example 4 | Good | Not dissolved | Good |
| Example 5 | Good | Good | Good |
| Example 6 | Good | Good | Good |
| Example 7 | Good | Good | Good |
| Example 8 | Good | Good | Good |
| Example 9 | Good | Not dissolved | Good |
| Example 10 | Good | Not dissolved | Good |
| Example 11 | Good | Not dissolved | Good |
| Comparative Example 1 | Not cured | — | — |
| Comparative Example 2 | Good | Not dissolved | Not dissolved |

[Evaluation of Resist Pattern by ArF Exposure]

(Evaluation of Resist Patterning: Evaluation Through PTD Process Involving Alkaline Development)

The above-prepared (Formula 6-1) organic underlayer film (layer A)-forming composition was applied onto a silicon wafer, and then baked on a hot plate at 240° C. for 60 seconds, to thereby form an organic underlayer film (layer A) having a thickness of 200 nm. Each of the Si-containing resist underlayer film (layer B)-forming compositions prepared in Examples 2, 4, 6, 8, 10, and 11 and Comparative Example 1 was applied onto layer A, and then baked on a hot plate at 180° C. for 60 seconds, to thereby form an Si-containing resist underlayer film (layer B). The Si-containing resist underlayer film (layer B) was found to have a thickness of 40 nm.

A commercially available resist solution for ArF (trade name: AR2772JN, available from JSR Corporation) was applied onto layer B with a spinner, and then heated on a hot plate at 110° C. for one minute, to thereby form a photoresist film (layer C) having a thickness of 120 nm.

By using a scanner NSR-5307E (available from Nikon Corporation) (wavelength: 193 nm, NA, a: 0.85, 0.93/0.85), the photoresist film was exposed to light through a mask designed to achieve a line width of 0.062 μm and an interline width of 0.062 μm (i.e., a 0.062 μm line and space (L/S)=1/1 dense line) in the photoresist after development. Thereafter, the photoresist film was baked on a hot plate at 100° C. for 60 seconds and then cooled, followed by development with a 2.38% alkaline aqueous solution for 60 seconds, to thereby form a positive pattern on the resist underlayer film (layer B). The resultant photoresist pattern was evaluated as "Good" when it did not have large pattern peeling, undercut, or a wide-bottomed line (footing). In the following table, "—" represents no evaluation.

TABLE 4

| | Pattern shape |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Comparative Example 1 | — |
| Comparative Example 2 | Good |

[Evaluation of Resist Pattern by KrF Exposure]

(Evaluation of Resist Patterning: Evaluation through PTD Process Involving Alkaline Development)

The above-prepared (Formula 6-1) organic underlayer film (layer A)-forming composition was applied onto a silicon wafer, and then baked on a hot plate at 240° C. for 60 seconds, to thereby form an organic underlayer film (layer A) having a thickness of 200 nm. Each of the Si-containing resist underlayer film (layer B)-forming compositions prepared in Example 9 and Comparative Example 1 was applied onto layer A, and then baked on a hot plate at 180° C. for 60 seconds, to thereby form an Si-containing resist underlayer film (layer B). The Si-containing resist underlayer film (layer B) was found to have a thickness of 80 nm.

A commercially available resist solution for KrF was applied onto layer B with a spinner, and then heated on a hot plate at 120° C. for one minute, to thereby form a photoresist film (layer C) having a thickness of 400 nm.

By using a scanner NSR-S205C (available from Nikon Corporation) (wavelength: 248 nm, NA, σ: 0.75, σ: 0.85, conventional), the photoresist film was exposed to light through a mask designed to achieve a line width of 0.16 μm and an interline width of 0.16 μm (i.e., a 0.16 μm line and space (L/S)=1/1 dense line) in the photoresist after development. Thereafter, the photoresist film was baked on a hot plate at 120° C. for 60 seconds and then cooled, followed by development with a 2.38% alkaline aqueous solution for 60 seconds, to thereby form a positive pattern on the resist underlayer film (layer B). The resultant photoresist pattern was evaluated as "Good" when it did not have large pattern peeling, extreme undercut, or a wide-bottomed line (footing). Through cross-sectional observation, the Si-containing resist underlayer film was evaluated as "Good" when it was completely removed with the developer, or evaluated as "Not removed" when it was not completely removed with the developer.

TABLE 5

| | Pattern shape | Removal with alkaline developer |
|---|---|---|
| Example 9 | Good | Good |
| Comparative Example 2 | Good | Not removed |

INDUSTRIAL APPLICABILITY

The present invention is useful as an ArF, KrF, or EUV resist underlayer film for forming a good pattern, and the resist underlayer film can be removed simultaneously with development of a resist by using an alkaline developer. Thus, the present invention is useful for a process in which a resist underlayer film is removed, in accordance with a resist pattern, simultaneously with development of a photoresist present above the resist underlayer film by using an alkaline developer for development of the photoresist after light exposure.

The invention claimed is:

1. A composition for forming a resist underlayer film for lithography, the resist underlayer film for lithography containing silicon and being dissolved and removed with an alkaline developer in accordance with a resist pattern together with an upper layer resist during development of the upper layer resist, the composition comprising:

a component (a), which is a silane compound, and an element (b), which is an element of causing dissolution in an alkaline developer, wherein the element (b) is contained in the structure of the silane compound of the component (a), wherein the silane compound of component (a) comprises a hydrolyzable silane of the following Formula (1), a hydrolysate of the hydrolyzable silane, a hydrolytic condensate of the hydrolyzable silane, or any combination of these:

Formula (1)

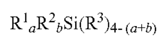

$R^1_aR^2_bSi(R^3)_{4-(a+b)}$ wherein $R^1$ is an organic group containing an organic group of the following Formulas (1-1), (1-2), (1-3), (1-4), or (1-5):

Formula (1-1)

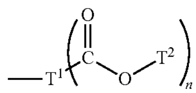

Formula (1-2)

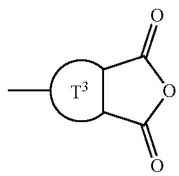

Formula (1-3)

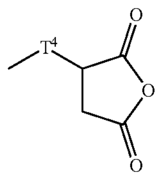

Formula (1-4)

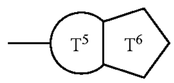

Formula (1-5)

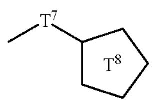

in Formulas (1-1), (1-2), (1-3), (1-4), and (1-5), $T^1$ is an alkylene group, a cyclic alkylene group, an alkenylene group, a sulfur atom, an oxygen atom, an oxycarbonyl group, an amide group, a secondary amino group, or any combination of these, $T^2$ is an alkyl group or a hydrogen atom, $T^3$ and $T^5$ are each an aliphatic ring or an aromatic ring, $T^4$ and $T^7$ are each an alkylene group, a cyclic alkylene group, an alkenylene group, an arylene group, a sulfur atom, an oxygen atom, an oxycarbonyl group, an amide group, a secondary amino group, or any combination of these, $T^6$ and $T^8$ are each a lactone ring, and n is an integer of 2, and $R^1$ is bonded to the silicon atom via an Si—C bond, and is the element (b) contained in the structure of the compound as the component (a);

$R^2$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, and is bonded to the silicon atom via an Si—C bond;

$R^3$ is an alkoxy group, an acyloxy group, or a halogen atom; and a is an integer of 1, b is an integer of 0 or 1, and a+b is an integer of 1 or 2; and an additional hydrolyzable silane, wherein the additional hydrolyzable silane is at least one organosilicon compound selected from the group consisting of organosilicon compounds of the following Formula (2);

Formula (2)

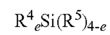

$R^4_eSi(R^5)_{4-e}$ wherein $R^4$ is an organic group having an aromatic ring or an isocyanuric structure, and is bonded to the silicon atom via an Si—C bond;

$R^5$ is an alkoxy group, an acyloxy group, or a halogen atom; and e is an integer of 0 to 3; and wherein the hydrolyzable silane of the Formula (1) is contained in an amount of 30% by mole to 100% by mole relative to all the silanes.

2. The composition for forming a resist underlayer film for lithography according to claim 1, wherein the hydrolyzable silane is a hydrolyzable silane of Formula (1), the additional hydrolyzable silane of Formula (2), and a further additional hydrolyzable silane that is an organosilicon compound of the following Formula (3):

Formula (3)

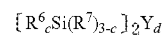

$\{R^6_cSi(R^7)_{3-c}\}_2Y_d$ wherein $R^6$ is an alkyl group and is bonded to the silicon atom via an Si—C bond, $R^7$ is an alkoxy group, an acyloxy group, or a halogen atom, Y is an alkylene group or an arylene group, c is an integer of 0 or 1, and d is an integer of 0 or 1.

3. The composition for forming a resist underlayer film for lithography according to claim 1, wherein the composition comprises, as a polymer, a hydrolysate of a hydrolyzable silane of Formula (1) and a hydrolyzable silane of Formula (2).

4. The composition for forming a resist underlayer film for lithography according to claim 1, wherein the composition further comprises an acid.

5. The composition for forming a resist underlayer film for lithography according to claim 1, wherein the composition further comprises water.

6. A method for producing a resist underlayer film for lithography, the method comprising a step of applying the composition for forming a resist underlayer film for lithography according to claim 1 onto a semiconductor substrate; and a step of baking the composition for forming a resist underlayer film for lithography.

7. A method for producing a semiconductor device, the method comprising:

a step (I) of applying a composition for forming a resist underlayer film for lithography onto a semiconductor substrate, the composition comprising:

a component (a), which is a silane compound, and an element (b), which is an element of causing dissolution in an alkaline developer, wherein the element (b) is contained in the structure of the silane compound of the component (a), wherein the silane compound of component (a) comprises a hydrolyzable silane of the following Formula (1), a hydrolysate of the hydrolyzable silane, a hydrolytic condensate of the hydrolyzable silane, or any combination of these:

Formula (1)

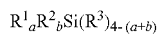

$$R^1_aR^2_bSi(R^3)_{4-(a+b)}$$

wherein $R^1$ is an organic group containing a phenolic hydroxyl group, or an organic group of the following Formulas (1-1), (1-2), (1-3), (1-4), or (1-5):

Formula (1-1)

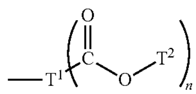

Formula (1-2)

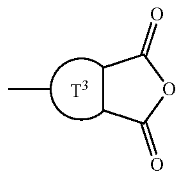

Formula (1-3)

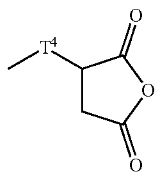

Formula (1-4)

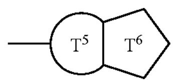

-continued

Formula (1-5)

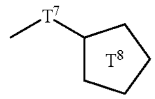

in Formulas (1-1), (1-2), (1-3), (1-4), and (1-5), $T^1$ is an alkylene group, a cyclic alkylene group, an alkenylene group, a sulfur atom, an oxygen atom, an oxycarbonyl group, an amide group, a secondary amino group, or any combination of these, $T^2$ is an alkyl group or a hydrogen atom, $T^3$ and $T^5$ are each an aliphatic ring or an aromatic ring, $T^4$ and $T^7$ are each an alkylene group, a cyclic alkylene group, an alkenylene group, an arylene group, a sulfur atom, an oxygen atom, an oxycarbonyl group, an amide group, a secondary amino group, or any combination of these, $T^6$ and $T^8$ are each a lactone ring, and n is an integer of 2, and $R^1$ is bonded to the silicon atom via an Si—C bond, and is the element (b) contained in the structure of the compound as the component (a);

$R^2$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, and is bonded to the silicon atom via an Si—C bond;

$R^3$ is an alkoxy group, an acyloxy group, or a halogen atom; and a is an integer of 1, b is an integer of 0 or 1, and a+b is an integer of 1 or 2; and an additional hydrolyzable silage, wherein the additional hydrolyzable silane is at least one organosilicon compound selected from the group consisting of organosilicon compounds of the following Formula (2);

Formula (2)

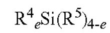

$$R^4_eSi(R^5)_{4-e}$$

wherein $R^4$ is an organic group having an aromatic ring or an isocyanuric structure, and is bonded to the silicon atom via an Si—C bond;

$R^5$ is an alkoxy group, an acyloxy group, or a halogen atom; and e is an integer of 0 to 3; and wherein the hydrolyzable silane of the Formula (1) is contained in an amount of 30% by mole to 100% by mole relative to all the silanes;

a step (II) of baking the composition for forming a resist underlayer film for lithography, to thereby form a resist underlayer film for lithography;

a step (III) of applying a resist composition to the surface of the underlayer film, to thereby form a resist film;

a step (IV) of exposing the resist film to light;

a step (V) of developing the resist and removing the resist underlayer film for lithography in accordance with a resist pattern by using an alkaline developer, to thereby form a pattern transferred from the resist pattern;

a step (VI) of processing the semiconductor substrate with the patterned resist and resist underlayer film for lithography; and a step (VII) of removing the resist underlayer film used for the semiconductor substrate in step (VI) with an alkaline aqueous solution after step (VI).

8. A method for producing a semiconductor device, the method comprising:

a step (i) of forming an organic underlayer film on the surface of a semiconductor substrate;

a step (ii) of applying the composition for forming a resist underlayer film for lithography according to claim 1 to the surface of the organic underlayer film;

a step (iii) of baking the composition for forming a resist underlayer film for lithography, to thereby form a resist underlayer film for lithography;

a step (iv) of applying a resist composition to the surface of the resist underlayer film for lithography, to thereby form a resist film;

a step (v) of exposing the resist film to light;

a step (vi) of developing the resist after the light exposure and removing the resist underlayer film for lithography in accordance with a resist pattern by using an alkaline developer, to thereby form a pattern transferred from the resist pattern;

a step (vii) of etching the organic underlayer film with the patterned resist underlayer film for lithography; and a step (viii) of processing the semiconductor substrate with the patterned organic underlayer film.

9. The method for producing a semiconductor device according to claim 8, wherein the method comprises a step of removing the resist underlayer film used for the substrate processing with an alkaline aqueous solution after the step (viii).

* * * * *